United States Patent [19]
Yoshioka et al.

[11] Patent Number: 5,968,691
[45] Date of Patent: Oct. 19, 1999

[54] METHOD AND APPARATUS FOR COATING RESIST AND DEVELOPING THE COATED RESIST

[75] Inventors: Kazutoshi Yoshioka, Kumamoto-ken; Kunie Ogata, Yokohama, both of Japan

[73] Assignee: Tokyo Electron Limited, Tokyo, Japan

[21] Appl. No.: 09/016,728

[22] Filed: Jan. 30, 1998

[30] Foreign Application Priority Data

Jan. 30, 1997 [JP] Japan ..................................... 9-017213

[51] Int. Cl.$^6$ ....................................................... G03F 9/00
[52] U.S. Cl. ........................... 430/30; 430/311; 430/327; 430/330
[58] Field of Search .............................. 430/30, 311, 327, 430/330; 216/12; 356/355, 357, 381

[56] References Cited

U.S. PATENT DOCUMENTS

| | | | |
|---|---|---|---|
| 5,393,624 | 2/1995 | Ushijima | ..................................... 430/30 |
| 5,656,182 | 8/1997 | Marchman et al. | ....................... 430/30 |

FOREIGN PATENT DOCUMENTS 0 729 072  8/1996  European Pat. Off. .

OTHER PUBLICATIONS

C. J. Raymond, et al., "Scatterometry for CD measurements of etched structures", SPIE, vol. 2725, Apr. 1996, pp. 720–728.

K. P. Bishop, et al., "Grating line shape characterization using scatterometry", SPIE, vol. 1545, International Conference on the Application and Theory of Periodic Structures, Feb. 1991, pp. 64–73.

John Sturtevant, et al., Proceedings of the Spie, vol. 2196, pp. 352–359, Feb. 28, 1994, "Use Of Scatterometric Latent Image Detector in Closed Loop Feedback Control of Linewidth".

Patent Abstracts of Japan, vol. 96, No. 8, Aug. 30, 1996, JP 8–111370, Apr. 30, 1996.

*Primary Examiner*—Christopher G. Young
*Attorney, Agent, or Firm*—Oblon, Spivak, McClelland, Maier & Neustadt, P.C.

[57] ABSTRACT

Disclosed is a resist coating-developing method, including (a) a setting step for setting a target value and an allowable range thereof, (b) a resist-coating step, (c) a pre-baking step, (d) a first cooling step, (e) a light-exposure step, (f) a line width measuring step for measuring a line width of a latent image, (g) a post-baking step, (h) a second cooling step, (i) a developing step, (j) a judging step determining whether or not the value of the line width of the latent image measured in step (f) falls within the allowable range of the target value set in step (a), (k) a calculating step determining a difference between the measured value of the latent image line width and the target value, and (l) a correcting step for correcting the process condition in at least one previous step.

11 Claims, 18 Drawing Sheets

METHOD AND APPARATUS FOR COATING RESIST AND DEVELOPING THE COATED RESIST

BACKGROUND OF THE INVENTION

The present invention relates to a method and apparatus for coating a surface of a substrate such as a semiconductor wafer or an LCD (liquid crystal display) substrate with a desired resist pattern and developing the coated resist pattern.

In photolithography, used is a resist processing system in which a semiconductor wafer is successively coated with a resist solution, followed by developing the coated resist. In a resist coating-developing system disclosed in, for example, U.S. Pat. No. 5,664,254 or Japanese Patent Publication (Kokoku) No. 2-30194, a large number of process units are arranged around a wafer transfer path, and wafers are transferred along the transfer path by a main arm mechanism into each of these process units so as to be processed successively. Since the resist coating-developing system of this type is used in combination with a light exposure unit, wafers are frequently transferred into and out of these coating-developing system and light exposure system.

In recent years, the required line width of a resist pattern is in a deep sub-micron region, making it absolutely necessary to control severely various parameters such as the amount of exposure to light and developing time. In many cases, the parameters for such a line width control are controlled by actually measuring the line width of the resist pattern for sample wafers optionally extracted by an operator. Where the actually measured line width fails to fall within an allowable range of a target value, the operator gives command signals to a host computer for changing various parameters for the line width control.

However, the conventional parameter control system, which depends on the operator's skill, is incapable of constantly improving the line width accuracy. Also, in many cases, the line width of a resist pattern is controlled by correcting the amount of light exposure in the exposure device. However, the required line width of a resist pattern tends to become finer and finer in recent years, with the result that the line width control system noted above is incapable of controlling the line width with a high precision in some cases. Further, a feed back system is employed in the conventional line width control for a resist pattern. In other words, the wafers which are not transferred into the feed back control system are regarded as defective, leading to a low yield. The resultant loss of wafers markedly increases the manufacturing cost of a semiconductor device because the wafers are sized bigger and bigger nowadays. Naturally, it is of high importance to improve the yield of wafers in the process step with resist.

BRIEF SUMMARY OF THE INVENTION

An object of the present invention is to provide a resist coating-developing method and apparatus which permit accurately controlling the line width of a resist pattern and also permit improving the yield.

Another object is to provide a resist coating-developing method and apparatus which permit controlling the line width of a resist pattern on a real time basis and also permit improving the through-put.

According to a first aspect of the present invention, there is provided a resist coating-developing method, comprising:

(a) a setting step for setting a target value and an allowable range thereof in respect of each of a pattern line width and a thickness of a resist film which is to be formed on a substrate;

(b) a resist-coating step for coating a surface of the substrate with a photoresist solution;

(c) a pre-baking step for baking a photoresist film formed on the surface of the substrate;

(d) a first cooling step for cooling the baked substrate;

(e) a light-exposure step for selectively exposing the photoresist coating film to light in a predetermined pattern;

(f) a line width measuring step for measuring a line width of a latent image formed on the resist coating film selectively exposed in advance to light;

(g) a post-baking step for baking the resist coating film selectively exposed in advance to light to form a pattern;

(h) a second cooling step for cooling the baked substrate;

(i) a developing step for developing the resist coating film selectively exposed to light in advance to form a pattern by applying a developing solution to the substrate;

(j) a judging step for judging whether or not the value of the line width of the latent image measured in the step (f) of measuring the latent image line width falls within the allowable range of the target value set in the step (a);

(k) a calculating step for calculating a difference between the measured value of the latent image line width and the target value, when the measured value of the latent image line width fails to fall within the allowable range of the target value, so as to determine a correcting amount in the process conditions in the steps falling within a range of between the resist coating step (b) and the developing step (i); and (l) a correcting step for correcting the process condition in at least one step selected from the group consisting of the resist coating step (b), light exposure step (e), post-baking step (g) and developing step (i), the correcting step being carried out in accordance with the correcting amount obtained in the step (k).

According to a second aspect of the present invention, there is provided a resist coating-developing method, comprising:

(A) a setting step for setting a target value and an allowable range thereof in respect of each of a pattern line width and a thickness of a resist film which is to be formed on a substrate;

(B) a resist-coating step for coating a surface of the substrate with a photoresist solution;

(C) a pre-baking step for baking a photoresist film formed on the surface of the substrate;

(D) a first cooling step for cooling the baked substrate;

(E) a light-exposure step for selectively exposing the photoresist coating film to light in a predetermined pattern;

(F) a post-baking step for baking the resist coating film selectively exposed in advance to light to form a pattern;

(G) a second cooling step for cooling the baked substrate;

(H) a developing step for developing the resist coating film selectively exposed to light in advance to form a pattern by applying a developing solution to the substrate;

(I) a line width measuring step for measuring a line width of the developed resist pattern;

(J) a judging step for judging whether or not the value of the line width measured in the step (I) of measuring the line width of the developed resist pattern falls within the allowable range of the target value set in the step (a);

(K) a calculating step for calculating a difference between the measured value of the line width and the target value, when the measured value of the line width fails to fall within the allowable range of the target value, so as to determine a correcting amount in the process conditions in the steps falling within a range of between the resist coating step (B) and the developing step (I); and (L) a correcting step for correcting the process condition in at least one step selected from the group consisting of the resist coating step (B), light exposure step (E), post-baking step (G) and developing step (I), the correcting step being carried out in accordance with the correcting amount obtained in the step (K).

According to a third aspect of the present invention, there is provided a resist coating-developing apparatus, comprising:

setting means for setting a target value and an allowable range thereof in respect of each of a line width and thickness of a resist pattern which is to be formed on a substrate;

a resist coating section for applying a resist solution onto the substrate while rotating the substrate on its own axis so as to form a resist coating film on the substrate;

a baking section for baking the resist coating film formed in the resist coating section;

a cooling section for cooling the substrate baked in the baking section;

a main arm mechanism for transferring the substrate so as to expose selectively the baked resist pattern in a predetermined pattern;

latent image line width measuring means for measuring the line width of a patterned latent image of the light-exposed resist coating film;

a spin chuck for rotatably holding the substrate;

a developing section equipped with a nozzle for applying a developing solution onto the resist coating film exposed in advance to light in a predetermined pattern; and a control section for feeding forward at least one condition selected from the group consisting of the developing time, the temperature of the developing solution, the baking time after the exposure to light, and the baking temperature after the exposure to light, the feeding forward being performed on the basis of the result of measurement of the latent image line width obtained from the latent image line width measuring means.

Further, according to a fourth aspect of the present invention, there is provided a resist coating-developing apparatus, comprising:

setting means for setting a target value and an allowable range thereof in respect of each of a line width and thickness of a resist pattern which is to be formed on a substrate;

a resist coating section for applying a resist solution onto the substrate while rotating the substrate on its own axis so as to form a resist coating film on the substrate;

a baking section for baking the resist coating film formed in the resist coating section;

a cooling section for cooling the substrate baked in the baking section;

a main arm mechanism for transferring the substrate so as to expose selectively the baked resist pattern in a predetermined pattern;

a spin chuck for rotatably holding the substrate;

a developing section equipped with a nozzle for applying a developing solution onto the resist coating film exposed in advance to light in a predetermined pattern;

line width measuring means for measuring the line width of the resist pattern developed in the developing section; and a control section for feeding back at least one condition selected from the group consisting of the developing time, the temperature of the developing solution, the baking time, the baking temperature, light-exposure time, focus distance in the exposure to light, the rotating speed of the substrate in the resist-coating step, the temperature of the resist solution, and the supply amount of the resist solution, the feeding back being performed on the basis of the result of measurement of the line width obtained from the line width measuring means.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Let us describe various preferred embodiments of the present invention with reference to the accompanying drawings.

Figure 1:
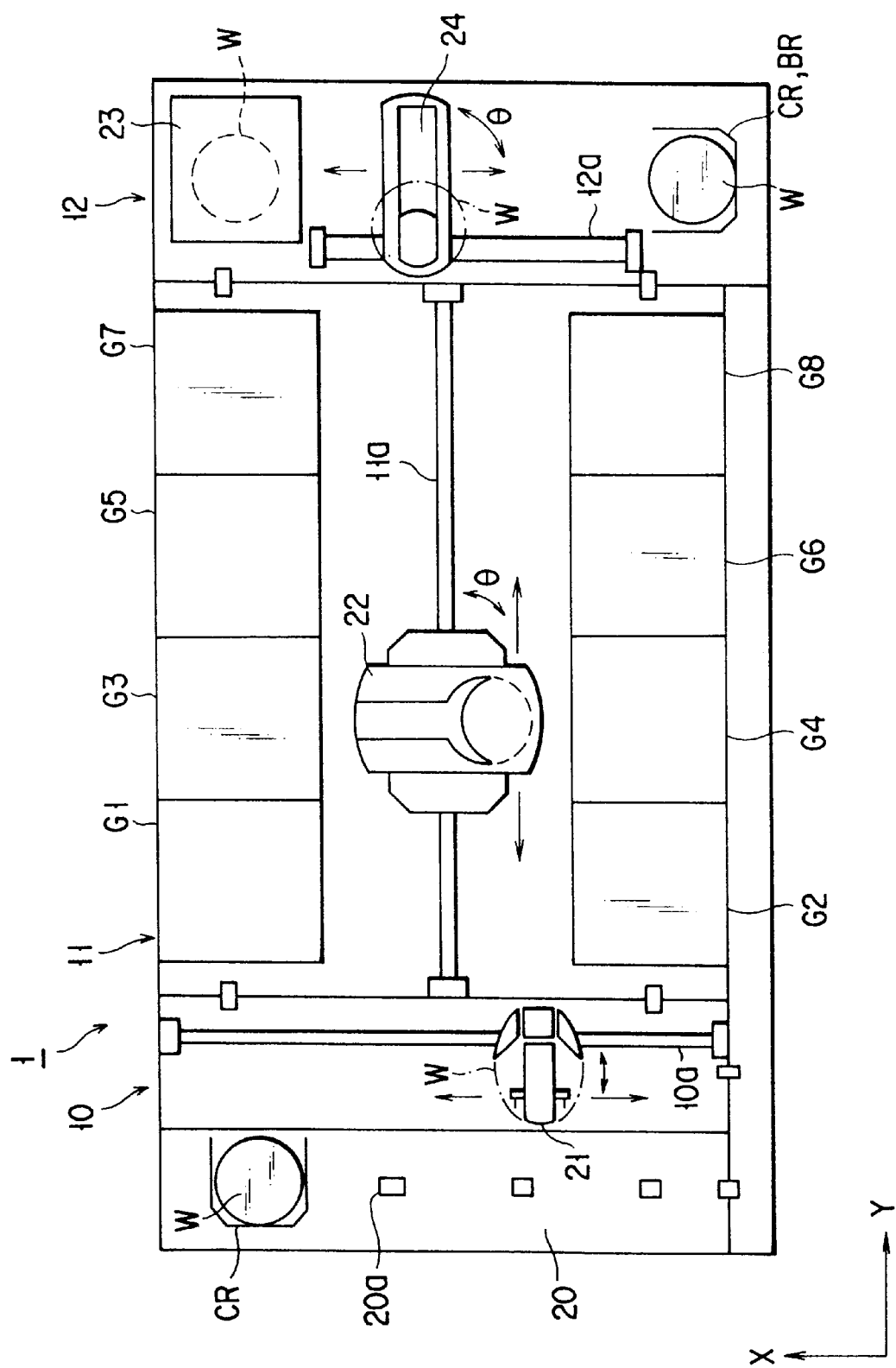
FIG. 1 is a front view schematically showing the entire resist processing system for processing a semiconductor wafer.

As shown in FIG. 1, a coating-developing system 1 comprises a cassette section 10, a process section 11, an interface section 12, a main arm mechanism 22, a first sub-arm mechanism 21, and a second sub-arm mechanism 24. Four cassettes C are disposed on a cassette table 20 arranged in the cassette section 10. These cassettes C are aligned along an X-axis. A plurality of semiconductor wafers W are housed in each of these cassettes C.

The first sub-arm mechanism 21 is movable along a transfer path 10a extending in the direction of the X-axis and included in the cassette section 10. Included in the first sub-arm mechanism 21 are an arm holder for holding the wafer, an X-axis driving mechanism for moving the arm holder along the transfer path 10a, a Z-axis driving mechanism for vertically moving the arm holder, an angle θ-swinging mechanism for swinging the arm holder by an angle θ about the Z-axis, and a back-and-forth driving mechanism for moving the arm holder back and forth. The wafer W is taken out of the cassette CR by the first sub-arm mechanism 21 and, then, delivered to the main arm mechanism 22 included in the process section 11.

The main arm mechanism 22 is arranged movable along a transfer path 11a included in the process section 11 and extending in a Y-axis direction. Included in the main arm mechanism 22 are an arm holder for holding the wafer W, a Y-axis driving mechanism for moving the arm holder along the transfer path 11a, a Z-axis driving mechanism for vertically moving the arm holder, an angle θ-swinging mechanism for swinging the arm holder about the Z-axis by an angle θ, and a back-and-forth driving mechanism for moving the arm holder back and forth. The main arm mechanism 22 receives the wafer W from the first sub-arm mechanism 21, transfers the received wafer W into each of the process units, and delivers the wafer W to a second sub-arm mechanism 24.

The process section 11 comprises 8 process unit groups $G_1$, $G_2$, $G_3$, $G_4$, $G_5$, $G_6$, $G_7$, and $G_8$ for applying a series of resist processing to the wafer W. As shown in the drawing, the odd-numbered process unit groups $G_1$, $G_3$, $G_5$, and $G_7$ are arranged side by side on one side (back side of the system) of the transfer path 11a, with the even-numbered process unit groups $G_2$, $G_4$, $G_6$, and $G_8$ being arranged side by side on the other side (front side of the system) of the transfer path 11a.

Figure 2:
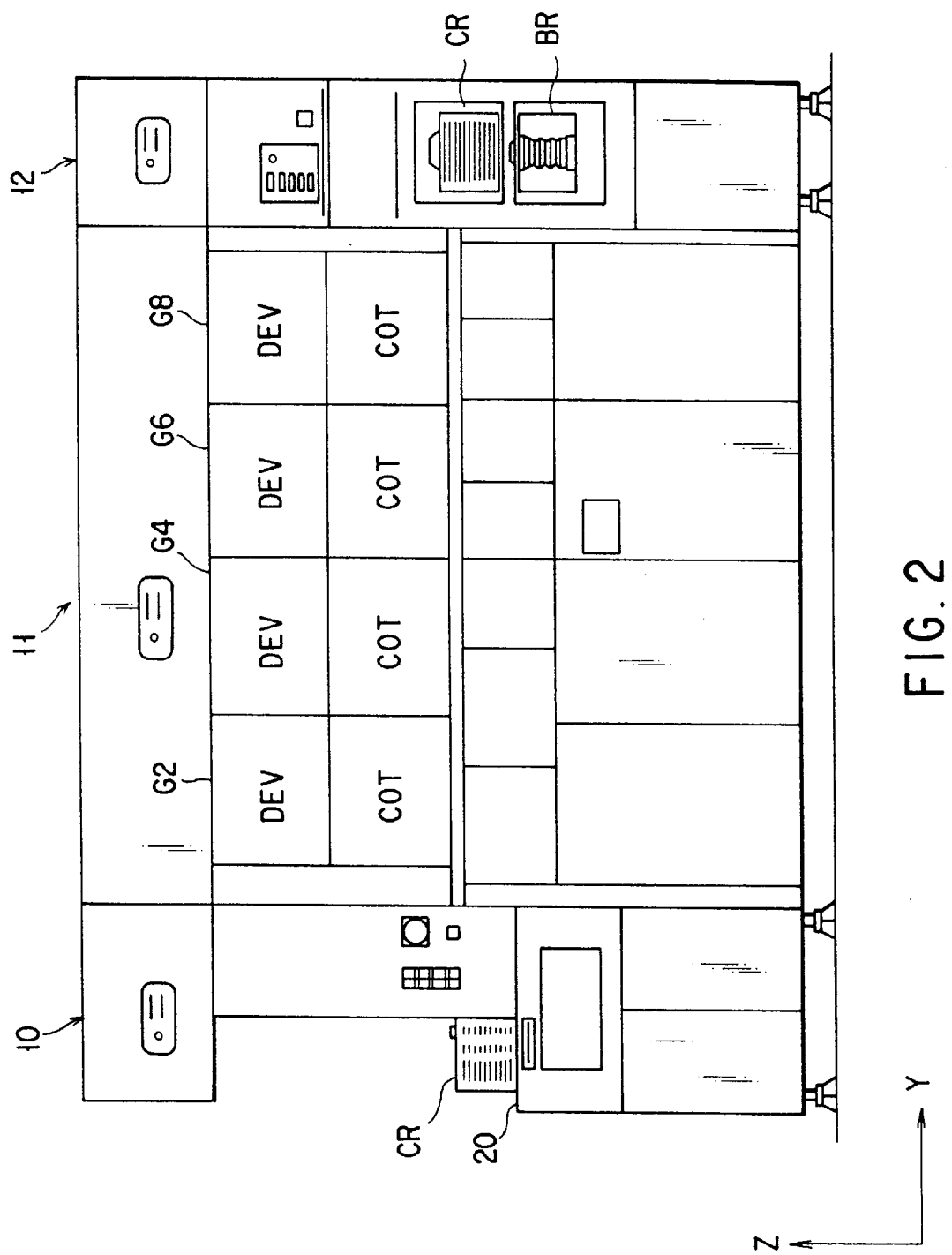
FIG. 2 is a front view showing in a magnified fashion a portion of the resist processing system shown in FIG. 1.
Figure 3:
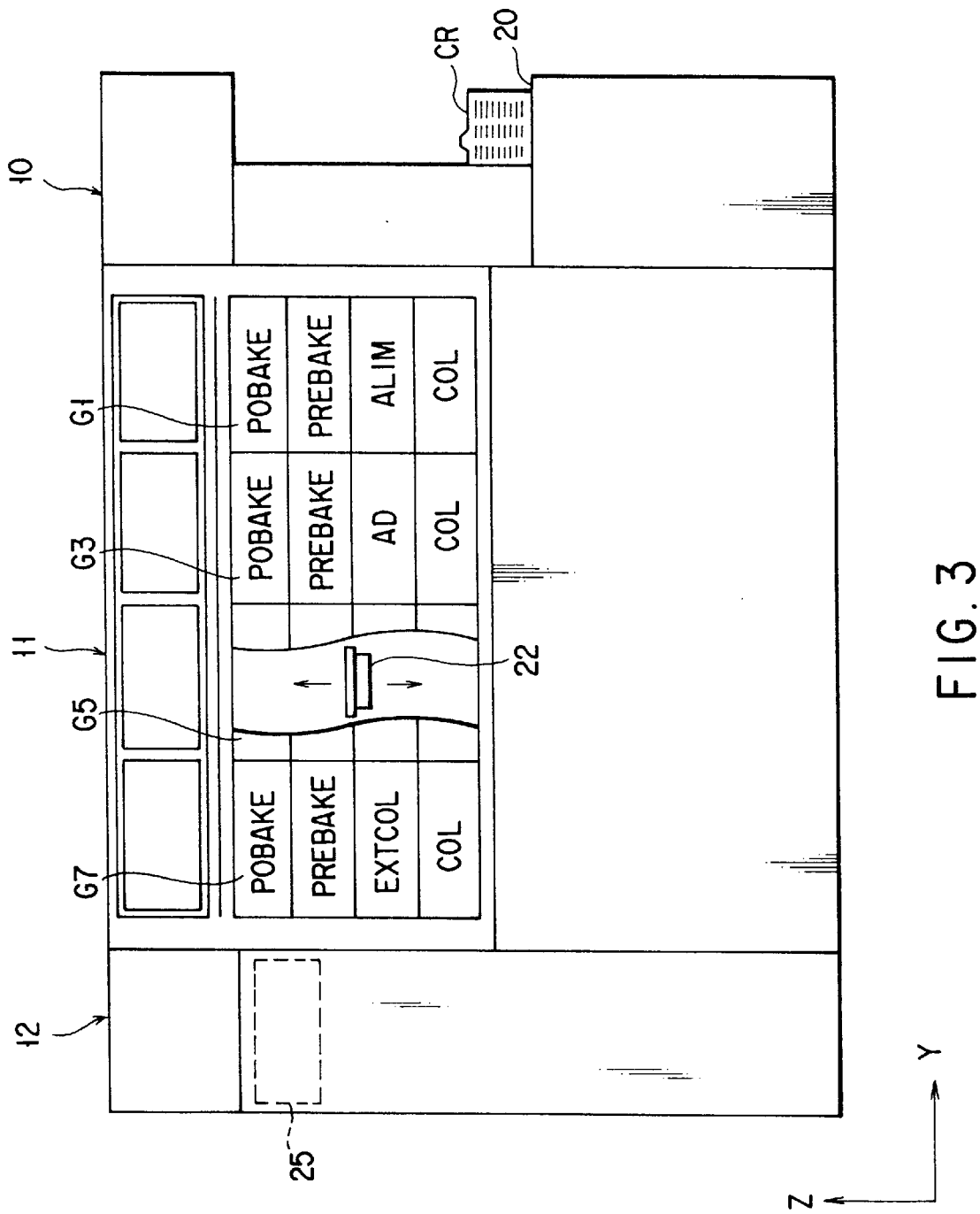
FIG. 3 is a back view showing in a magnified fashion a portion of the resist processing system shown in FIG. 1.

As shown in FIG. 2, each of the even numbered process unit groups $G_2$, $G_4$, $G_6$, and $G_8$ includes a resist coating unit (COT) and a developing unit (DEV) stacked on the coating unit (COT). On the other hand, each of the odd-numbered process unit groups $G_1$, $G_3$, $G_5$, and $G_7$ consists of four process units which are stacked one upon the other, as shown in FIG. 3. To be more specific, the first process unit group $G_1$ includes a cooling unit (COL), an alignment unit (ALIM), a pre-baking unit (PREBAKE), and a post-baking unit (POBAKE), which are stacked one upon the other in the order mentioned such that the cooling unit (COL) constitutes the lowermost unit.

The third process unit group $G_3$ includes a cooling unit (COL), an adhesion unit (AD), a pre-baking unit (PREBAKE), and a post-baking unit (POBAKE), which are stacked one upon the other in the order mentioned such that the cooling unit (COL) constitutes the lowermost unit.

Further, each of the fifth and seventh process unit groups $G_5$ and $G_7$ includes a cooling unit (COL), an extension-cooling unit (EXTCOL), a pre-baking unit (PREBAKE) and a post-baking unit (POBAKE), which are stacked one upon the other in the order mentioned such that the cooling unit (COL) constitutes the lowermost unit.

It should be noted that the cooling unit (COL) and the extension-cooling unit (EXTCOL) each requiring a low process temperature are arranged in the lower stages of each of the process unit groups of the stacked structure. On the other hand, the pre-baking unit (PREBAKE), the post-baking unit (POBAKE) and the adhesion unit (AD) each requiring a high process temperature are arranged on the upper stages. The particular arrangement is effective for suppressing the mutual thermal interference among the process units included in the process unit group.

Figure 4:
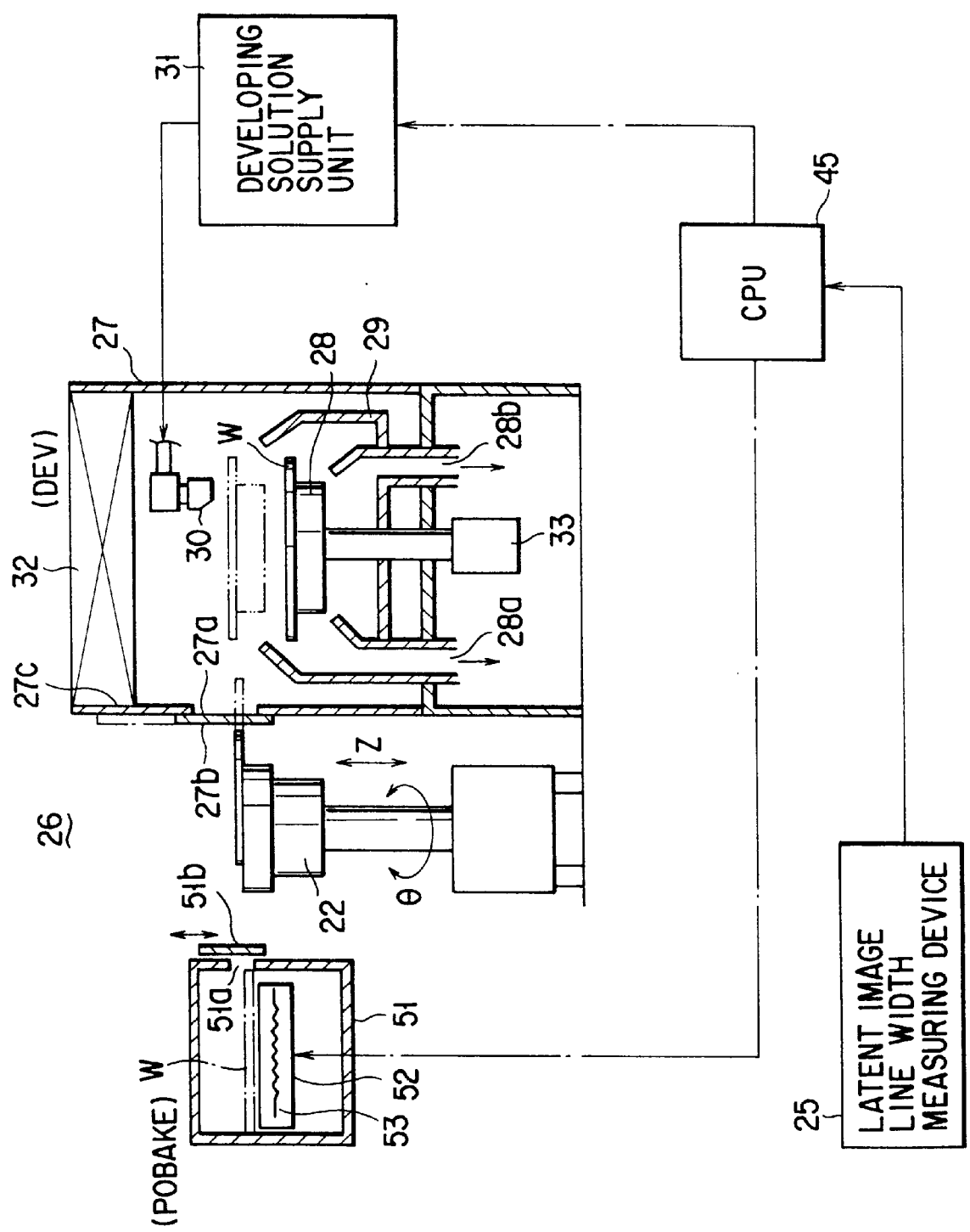
FIG. 4 is a cross sectional view schematically showing the construction of a resist coating-developing apparatus (developing unit and post-baking unit) according to one embodiment of the present invention.

As shown in FIGS. 1 and 3, arranged in the interface section 12 are a movable pick-up cassette CR, a stationary buffer cassette BR, a peripheral light-exposure device 23, a second sub-arm mechanism 24 and a latent image line width measuring device 25. The line width of the light-exposed portion and/or non-exposed portion of a latent image pattern formed in a light-exposure step S9 is measured by the latent image line width measuring device 25, and the data on the line width thus measured is transmitted to a CPU 45 (FIG. 4). The latent image line width measuring device 25 is described in, for example, "Multi-parameter CD Metrology Measurements" (IC.J. Raymond; M. R. Muranase) and "Grating line shape Characterization Using Scatterometry" (IK.P Bishop; S. M. Gaspar).

The second sub-arm mechanism 24, which is arranged on a transfer path 12a formed in the interface section 12 and extending in an X-axis direction, includes an arm holder for holding the wafer W, an X-axis driving mechanism for moving the arm holder along the transfer path 12a, a Z-axis driving mechanism for vertically moving the arm holder, an angle θ-swinging mechanism for swinging the arm holder about the Z-axis, and a back-and-forth driving mechanism for moving the arm holder back and forth. The wafer W is delivered from the main arm mechanism 22 to the second sub-arm mechanism 24. Then, the wafer W is delivered from the second sub-arm mechanism 24 into each of the cassettes CR, BR and the peripheral light-exposure device 23. Further, the wafer W is put into and taken out of the light-exposure device (not shown).

As shown in FIG. 4, the developing unit (DEV) includes a process vessel 27, a spin chuck 28, a cup 29 and a nozzle 30. A wafer transfer port 27a is formed through one side wall of the process vessel 27. The wafer W is put into or taken out of the process vessel 27 through the wafer transfer port 27a. A shutter 27b is mounted to the wafer transfer port 27a. If the shutter 27b is closed, the developing atmosphere within the process vessel 27 is shielded from the atmosphere within a wafer transfer section 26.

The spin chuck 28 is joined to a rotary driving shaft of a motor 33 the rotation of which is controlled by the CPU 45, and is supported by a lift means (not shown) so as to be movable in the Z-axis direction. Further, an exhaust port of a vacuum suction mechanism (not shown) is open at the upper end portion of the spin chuck 28 so as to permit the wafer W to be held by vacuum suction on the upper surface of the spin chuck 28.

A cup 29 is arranged to surround the lower portion in the outer circumferential surface of the spin chuck 28. Drain ports 28a, 28b are formed in the bottom portion of the cup 29. One drain port 28a communicates with a waste liquid passageway for discharging the waste liquid, with the other drain port 28b communicating with an exhaust passageway.

The nozzle 30 communicates with a tank (not shown) arranged within a developing solution supply device 31. Arranged within the developing solution supply nozzle 31 is a temperature controller (not shown) for controlling (correcting) the temperature of the developing solution in accordance with a control command signal given from the CPU 45. The nozzle 30, which is supported by a scan moving mechanism (not shown), is allowed to perform a scan movement between a waiting position apart from the spin chuck 28 and an operating position right above the center of rotation of the spin chuck.

An air inlet port 27c is formed in a ceiling portion of the process vessel 27 in which is arranged a filter 32. The filter 32 is capable of removing the particles contained in the air and also capable of removing alkali components such as ammonia and amines from the air.

As shown in FIG. 4, a hot plate 52 having a resistance heat generator 53 buried therein is arranged within a vessel 51 of a post-baking unit (POBAKE). In introducing the wafer W into the post-baking unit, a shutter 51 is opened, and the wafer W is introduced by the main arm mechanism 22 into the vessel 51 through a wafer transfer port 51a. The wafer W thus introduced into the vessel 51 is disposed on the hot plate 52 so as to permit the wafer W to be baked. Incidentally, the power source of the hot plate 52 is controlled by the CPU 45.

The latent image line width measuring device 25 is connected to an input terminal of the CPU 45. Upon receipt of a measuring signal delivered from the latent image line width measuring device 25, the CPU 45 reads out the set data stored in a memory and performs a predetermined arithmetic comparative operation between the data read from the memory and the measured data. A predetermined arithmetic formula is used for the arithmetic comparative operation performed within the CPU 45. Then, the CPU 45 delivers a feed forward command signal or a feed back command signal to each process unit based on the result of the arithmetic comparative operation so as to control the operation of each of the process units such that the pattern line width is allowed to have a correct value.

The term "set data" noted above denote the data obtained by using a product wafer W or a dummy wafer DW on the process conditions which permit the pattern line width to have a target value, e.g., 0.25 μm. Such a data is stored in the memory of the CPU 45 for each of the process conditions. The set data, which is not necessarily a constant, includes as a factor variable parameters such as process environments, e.g., temperature, humidity, pressure and atmosphere. It follows that the set data is corrected appropriately in accordance with a change in the variable parameters.

In the embodiment shown in the drawing, attentions are paid to, particularly, the post-baking temperature and/or the developing solution temperature as a variable parameter affecting the line width (real image line width) of the resist pattern after the development. To be more specific, the CPU 45 serves to obtain the corrected value of the appropriate post-baking temperature and/or the developing solution temperature conforming with a difference between the measured value of the line width of the latent image pattern and a target value, and to deliver command signals for the parameter correction to the baking temperature controller and/or the developing solution temperature controller.

Figure 5:
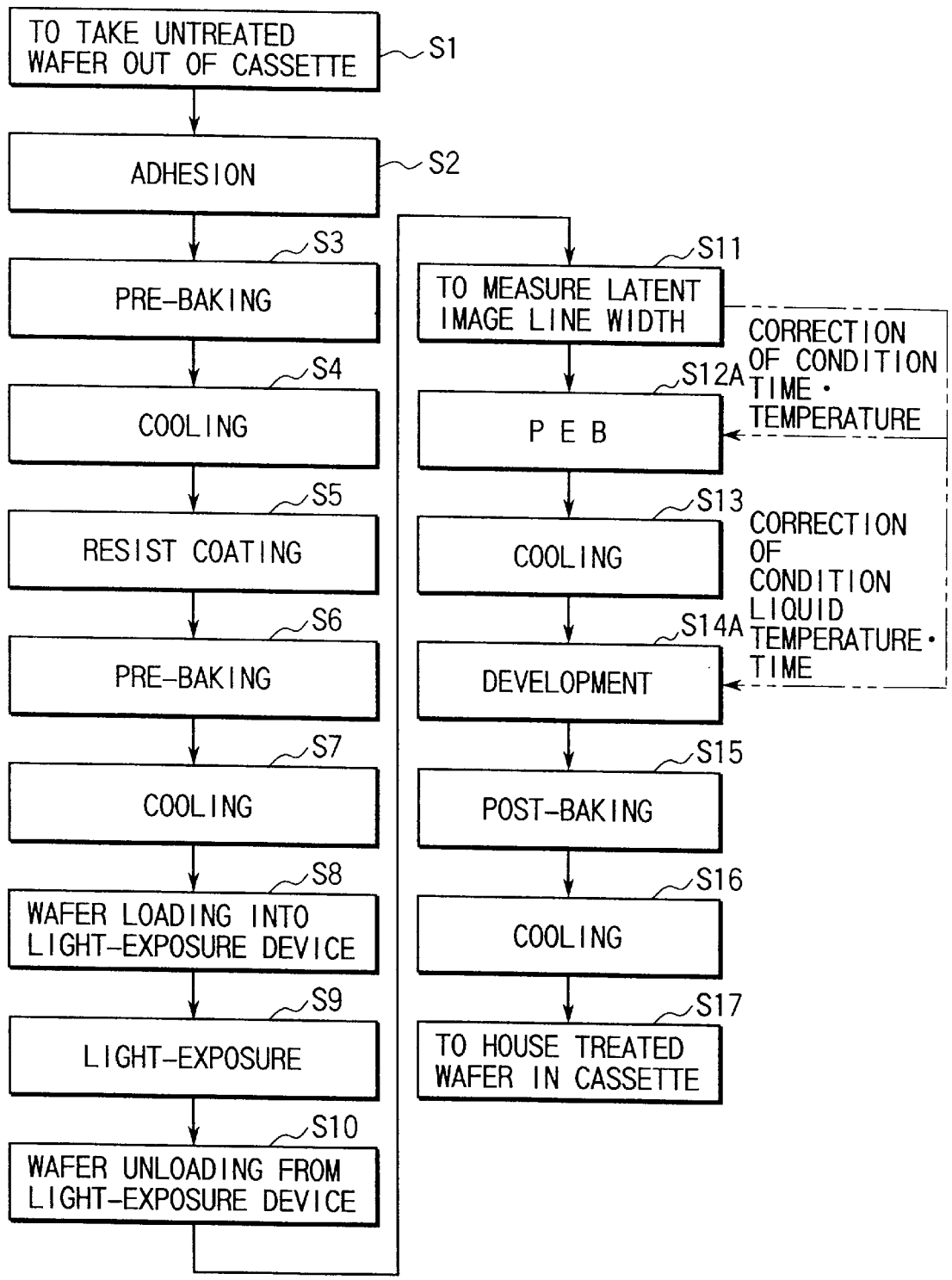
FIG. 5 is a flow chart showing a resist coating-developing method according to one embodiment of the present invention.

FIG. 5 shows how the wafer W is processed by the coating-developing system of the construction described above. Specifically, the first sub-arm mechanism 21 is moved to reach the cassette CR disposed on the cassette table 20 and takes one wafer W before processing out of the cassette CR (step S1). Then, the wafer W is delivered from the first sub-arm mechanism 21 onto the main arm mechanism 22 included in the process section 11. Further, the wafer W is loaded by the main arm mechanism 22 into an alignment unit (ALIM) included in the first process unit group $G_1$.

The orientation flat of the wafer W is aligned within the alignment unit (ALIM). Also, centering of the wafer W is performed in the alignment unit (ALIM). Then, the wafer W is transferred by the main arm mechanism 22 into an adhesion unit (AD) included in the third process unit group $G_3$ for application of an adhesion treatment to the wafer W with an HMDS gas (step S2).

After the adhesion treatment, the main arm mechanism 22 transfers the wafer W into a pre-baking unit (PREBAKE) for pre-baking the wafer W at a predetermined temperature (step S3). Further, the wafer W is transferred into a cooling unit (COL) so as to be cooled. The wafer W is cooled within the cooling unit (COL) to a set temperature before the resist coating treatment, e.g., 23° C. (step S4).

In the next step, the main arm mechanism 22 transfers the wafer W into a resist coating unit (COT), and the wafer W is disposed on the spin chuck. In this step, a resist solution is applied to the wafer W while rotating the spin chuck supporting the wafer W so as to permit the wafer surface to be coated with the resist solution (step S5).

After the coating treatment, the main arm 22 takes the wafer W out of the resist coating unit (COT) and, then, transfers again the wafer W into the pre-baking unit (PREBAKE), with the result that the wafer W is baked at, for example, 100° C., for a predetermined period of time (step S6). During the pre-baking treatment, the solvent remaining within the coated resist film is removed by evaporation so as to stabilize the film quality.

Then, the main arm mechanism 22 transfers the wafer W into an extension-cooling unit (EXTCOL). The wafer W is cooled within the extension-cooling unit (EXTCOL) to a temperature, e.g., 24° C., adapted for the succeeding step, i.e., peripheral light exposure treatment performed by a peripheral light exposure device 23 (step S7). After the cooling treatment, the wafer W is delivered from the main arm mechanism 22 to the second sub-arm mechanism 24. Then, the wafer W is transferred by the sub-arm mechanism 24 into the peripheral light-exposure device 23 arranged within the interface section 12 so as to expose the coated resist in the peripheral portion of the wafer to light (peripheral light exposure treatment).

After completion of the peripheral light exposure treatment, the second sub-arm mechanism 24 transfers the wafer W into a light-exposure device, which is not shown in the drawing (step S8). If another wafer is under a light exposure treatment in this step, the wafer W transferred by the second sub-arm mechanism 24 is housed temporarily in the buffer cassette BR and kept housed in the buffer cassette BR until completion of the processing of said another wafer W.

In the next step, the entire surface of the coated resist is exposed to light within a light exposure device, which is not shown in the drawing, to form a predetermined latent image pattern on the exposed resist (step S9). The term "latent image pattern" noted above denotes a pattern formed by a denatured resist portion caused by a chemical change upon exposure to light and a non-denatured resist portion (non-exposed portion) around the denatured portion. In other words, the "latent image pattern" denotes an image of a pattern which has not yet been made visible before the developing step.

After completion of the light exposure treatment, the second sub-arm mechanism 24 takes the wafer W out of the light exposure device (step S10) and, then, transfers the wafer W into the latent image line width measuring device 25 arranged within the interface section 12. The latent image consisting of the light exposed portion and the non-exposed portion on the surface of the wafer W is chemically recognized within the latent image line width measuring device 25. Then, the line width of the latent image (line width of the light exposed portion and/or line width of the non-exposed portion) is measured in the measuring device 25 (step S11). The information on the latent image pattern is converted into the CPU 45.

Figure 6:
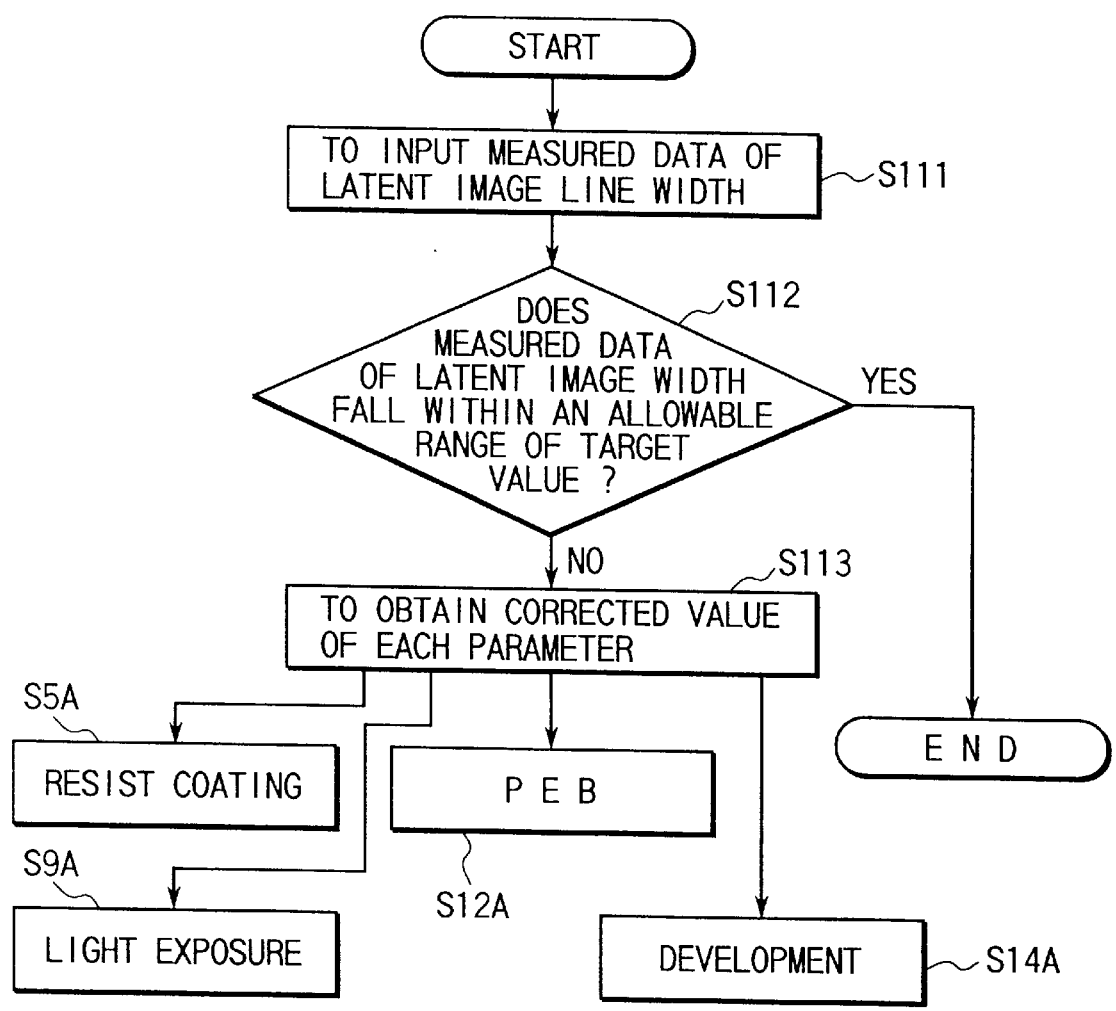
FIG. 6 is a flow chart showing the procedures for controlling the line width of a resist film.

FIG. 6 is a sub-flow chart showing the operation of the CPU 45 performed upon receipt of the measured data on the latent image line width. As shown in the sub-flow chart, the measured data on the line width of the latent image pattern is supplied from the latent image line width measuring device 25 into the CPU 45 (step S111). The measured data on the line width is converted within the CPU 45 into a numeral value denoting the measured value of the line width, which is compared with the target value so as to determine whether or not the measured value of the line width falls within an allowable range (step S112). Where the result of determination in step S112 is "NO", optimum post-exposure baking (PEB) temperature and developing solution temperature are determined as parameter correction values in accordance with a difference between the measured value of the line width and the target value in order to make the line width of the resist pattern (actual line width) after the development appropriate (step S113). Then, the CPU 45 delivers command signals corresponding to these parameter correction values to the baking temperature controller and the developing solution temperature controller, respectively, so as to apply the feed back control to a PEB process step S12A and a developing step S14A. The CPU 45 also delivers command signals corresponding to the parameter correction values to a spin chuck 61 of the resist coating unit (COT), a resist solution control device 63, and a shutter driving section and focus driving section of a light exposure device so as to apply the feed back control to each of the resist coating step S5A and the exposure step S9A. On the other hand, where the result of determination in step S112 is "YES", no command signal is delivered from the CPU 45 so as to continue the processing without changing any of the process conditions.

The second sub-arm mechanism 24 takes the wafer W out of the latent image line width measuring device 25 and, then, delivers the wafer W to the main arm mechanism 22 included in the process section 11. Incidentally, it is possible to store temporarily the wafer W in the buffer cassette BR before the wafer is delivered to the main arm mechanism 22. The wafer W received by the main arm mechanism 22 is transferred into the post-baking unit (POBAKE) in which a PEB treatment is applied to the wafer W. As described previously, the PEB treating temperature is corrected to an optimum value by a baking temperature controller (not shown) which is controlled by the CPU 45 (step S12A).

After the PEB treatment, the main arm mechanism 22 serves to transfer the wafer W to any one of the cooling units (COL) so as to cool the wafer W to about room temperature (step S13). Then, the main arm mechanism 22 serves to transfer the wafer W into any one of the developing units (DEV) and to dispose the wafer W on the spin chuck 28. In the developing unit (DEV), a developing solution is applied to the wafer W while rotating the spin chuck supporting the wafer W so as to develop the light-exposed resist pattern. As described above, the temperature of the developing solution (TMAH solution) is corrected to an optimum value by a developing solution temperature controller (not shown) which is controlled by the CPU 45 (step S14A).

After the development, a rinsing liquid (pure water) is applied to the wafer W which is kept rotated so as to wash away the developing solution from the wafer surface. Then, the main arm mechanism 22 transfers the wafer W from the developing unit (DEV) to the post-baking unit (POBAKE). The wafer W is baked at, for example, 100° C. for a predetermined period of time within the post-baking unit (POBAKE) (step S15). In this post-baking step S15, the resist film swollen by the developing solution is cured so as to improve the resistance of the resist film to chemicals.

In the next step, the main arm mechanism 22 transfers the wafer W from the post-baking unit (POBAKE) to the cooling unit (COL), in which the wafer is cooled (step S16). After the wafer W is cooled to room temperature, the main arm mechanism 22 delivers the wafer W to the first sub-arm mechanism 21. Then, the wafer W is put by the first sub-arm mechanism 21 in a predetermined wafer housing groove formed in the cassette CR disposed on the cassette table 20 for housing the processed wafer (step S17).

In the embodiment described above, the line width of the latent image pattern is measured after the light-exposure step and before the developing step. Where the measured value of the line width fails to fall within an allowable range of the target value, each of, for example, the post-baking temperature and the developing solution temperature is corrected. It is possible to permit the line width of the actually developed resist pattern to fall within the allowable range of target value by applying the particular feed forward control.

In the embodiment described above, the feed forward control is applied simultaneously to the post-baking temperature and the developing solution temperature used as parameters to be controlled. However, the present invention is not limited to the particular embodiment. Specifically, it is possible to apply the feed forward control to only any one of the post-baking temperature and the developing solution temperature.

Further, the PEB time, developing time and concentration of the developing solution can be taken up as factors affecting the line width of the resist pattern which is finally obtained. Still further, the heating temperature can be taken up as the factor which affects the line width in the case where the temperature within the post-baking unit (POBAKE) is elevated to a desired level (for example, the temperature elevation from the pre-heating temperature of 100° C. to 150° C., after the wafer W is transferred into the post-baking unit.

Figure 7:
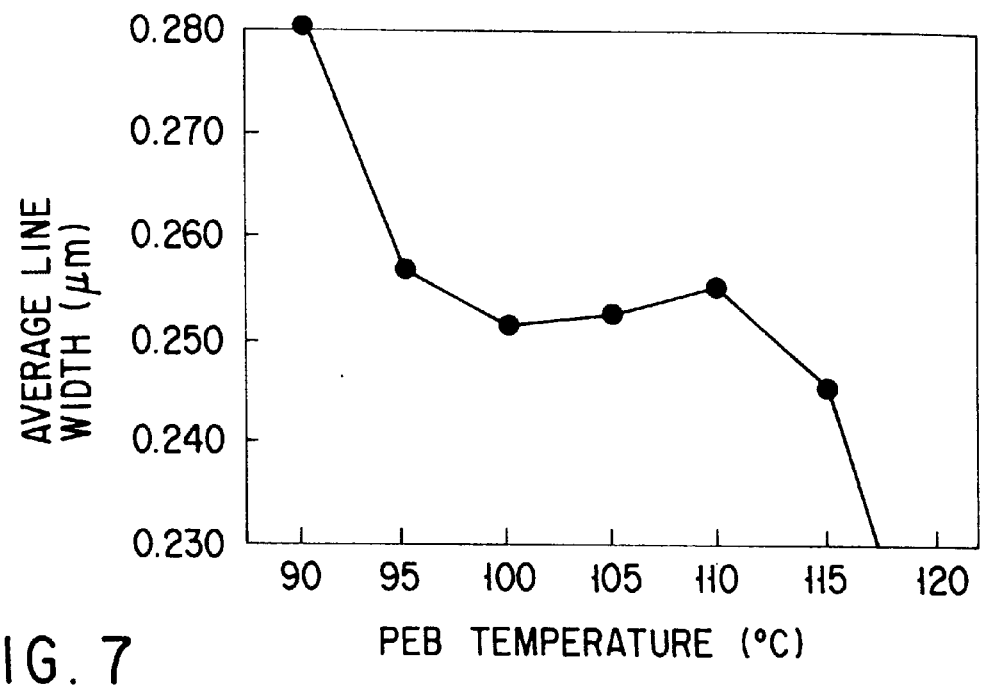
FIG. 7 is a graph showing the relationship between the PEB temperature (°C.) and the average line width ($\mu$m)

FIG. 7 is a graph showing the relationship between the PEB temperature, which is plotted on the abscissa, and the average line width (μm) of the pattern, which is plotted on the ordinate. The resist solution used for the coating was prepared by adding a suitable amount of a solvent PGMEA to TDUR-P007, which is a trade name of a resist solution consisting of an acetal protective group resin and manufactured by Tokyo Ohka Kogyo K.K. On the other hand, PGMEA represents propylene glycol monomethyl ether acetate. In this experiment, the treating time at the PEB temperature was set at 90 seconds. Also, the target value of the line width was set at 0.25 μm.

As apparent from FIG. 7, the line width of the pattern was found to tend to decrease with increase in the PEB temperature. Within the temperature range of 95 to 115° C., the line width of the pattern was stabilized in the vicinity of the target value.

Figure 8:
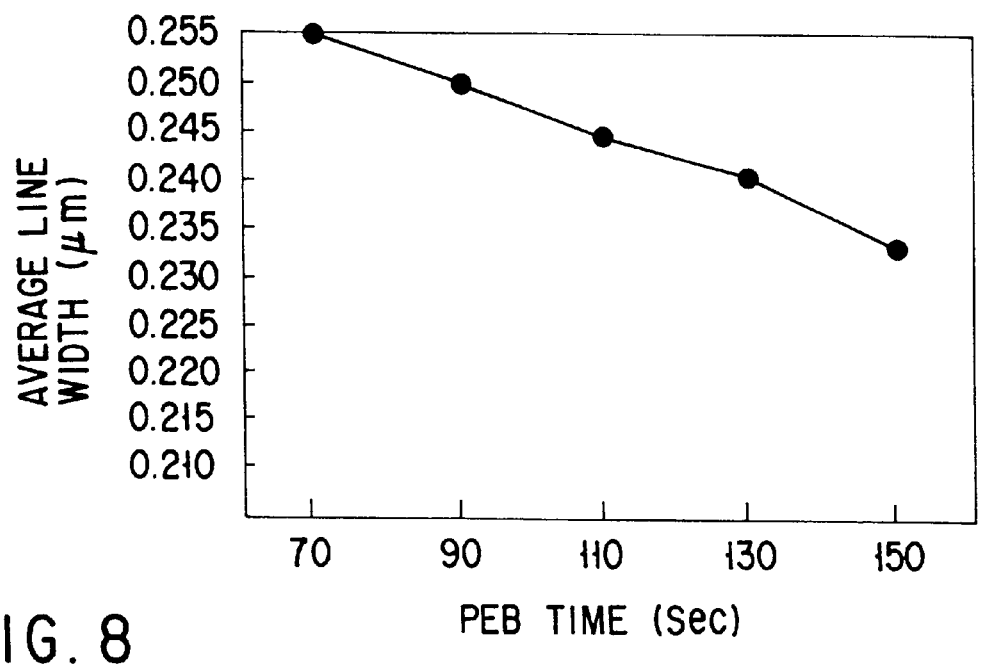
FIG. 8 is a graph showing the relationship between the PEB time (sec.) and the average line width ($\mu$m)

FIG. 8 is a graph showing the relationship between the PEB time (seconds), which is plotted on the abscissa, and the average line width (μm) of the pattern. The resist solution used for the coating was equal to that used in the experiment relating to FIG. 7. The treating temperature at the PEB time was set at 110° C. Also, the target value of the line width was set at 0.25 μm.

As apparent from FIG. 8, the line width of the pattern was found to tend to decrease with increase in the PEB time. To be more specific, the line width of the pattern at the PEB time of 70 seconds, 90 seconds, 110 second, 130 seconds and 150 seconds was found to be 0.255 μm, 0.250 μm, 0.245 μm, 0.240 μm, and 0.235 μm, respectively.

Figure 9:
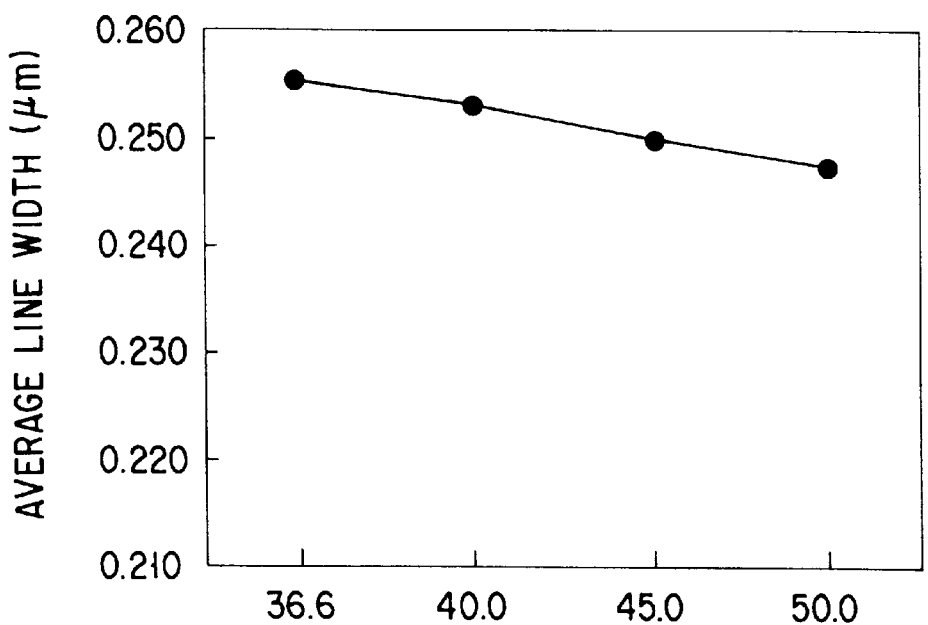
FIG. 9 is a graph showing the relationship between the PEB relative humidity (%) and the average line width ($\mu$m)

FIG. 9 is a graph showing the relationship between the relative humidity of the PEB treating atmosphere, which is plotted on the abscissa, and the average line width, which is plotted on the ordinate. The resist solution used for the coating was equal to that used in the experiment relating to FIG. 7. The PEB treatment was carried out at 110° C. for 90 seconds. Also, the target value of the line width was set at 0.25 μm.

As apparent from FIG. 9, the line width of the pattern was found to tend to decrease gradually with increase in the relative humidity of the PEB treating atmosphere. Specifically, the pattern line width was found to be 0.255 μm, 0.252 μm, 0.250 μm (target value), and 0.2425 μm when the relative humidity was set at 36.5%, 40%, 45%, and 50%, respectively.

Figure 10:
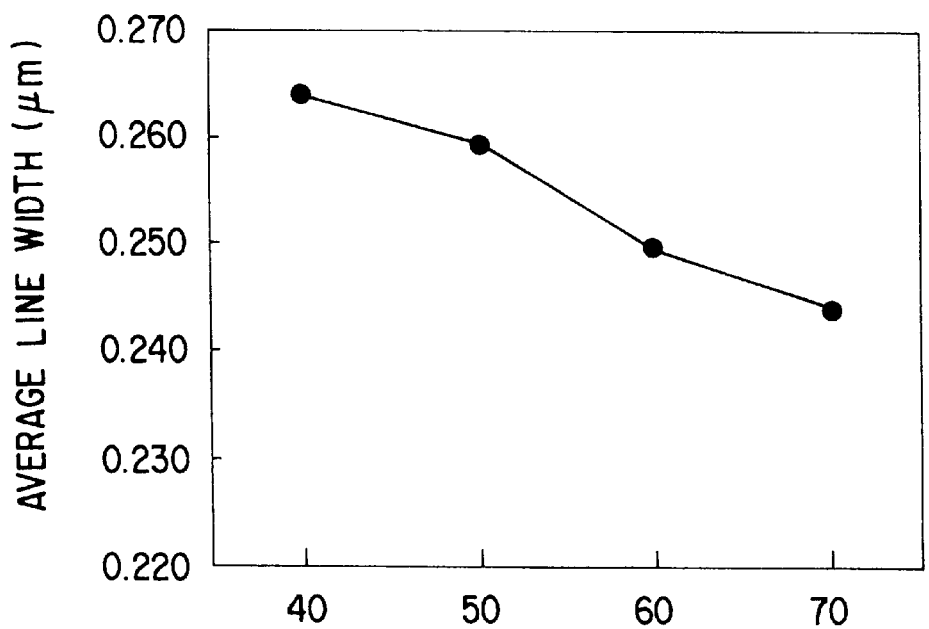
FIG. 10 is a graph showing the relationship between the developing time (sec.) and the average line width ($\mu$m)

FIG. 10 is a graph showing the relationship between the development time (seconds), which is plotted on the abscissa, and the average line width (μm) of the pattern, which is plotted on the ordinate. The PEB treatment was carried out at 110° C. for 90 seconds. Also, the target value of the line width was set at 0.25 μm. Incidentally, the developing treatment was carried out at room temperature using tetramethyl ammonium hydroxide (TMAH).

As apparent from FIG. 10, the line width of the pattern was found to tend to decrease with increase in the developing time. Specifically, the line width of the pattern was found to be 0.264 μm, 0.259 μm, 0.250 μm (target value), and 0.244 μm when the developing time was set at 40 seconds, 50 seconds, 60 seconds, and 70 seconds, respectively.

Figure 11:
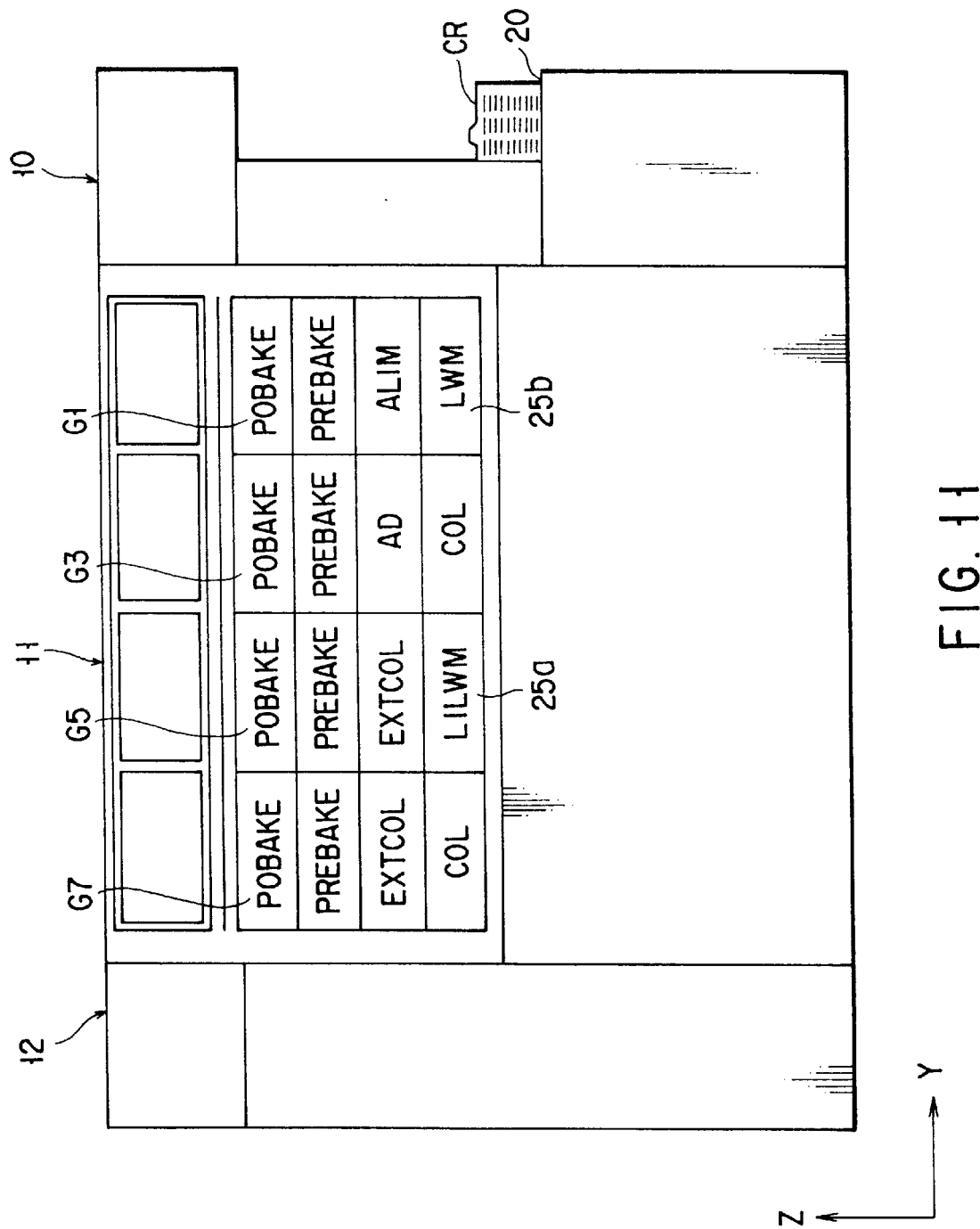
FIG. 11 is a back view schematically showing the construction of a coating-developing system according to another embodiment of the present invention.

The line width of the pattern or pattern latent image can be measured at various timings, making it possible to mount the latent image line width measuring device 25 at various portions within the coating-developing system 1. For example, it is possible to allow an LILWM unit 25a provided with a latent image line width measuring device to be included in the process unit group within the process section 11, as shown in FIG. 11. As shown in FIG. 5, it is possible to load the wafer W in the LILWM unit 25a so as to measure the line width of the latent image pattern (step S11) before the PEB step S12A. It is desirable to mount the LILWM unit 25a at a position where the unit 25a is most unlikely to be thermally affected by the pre-baking unit (PREBAKE) and the post-baking unit (POBAKE). For example, it is most desirable to mount the LILWM unit 25a at a position adjacent to the cooling unit (COL).

Figure 12:
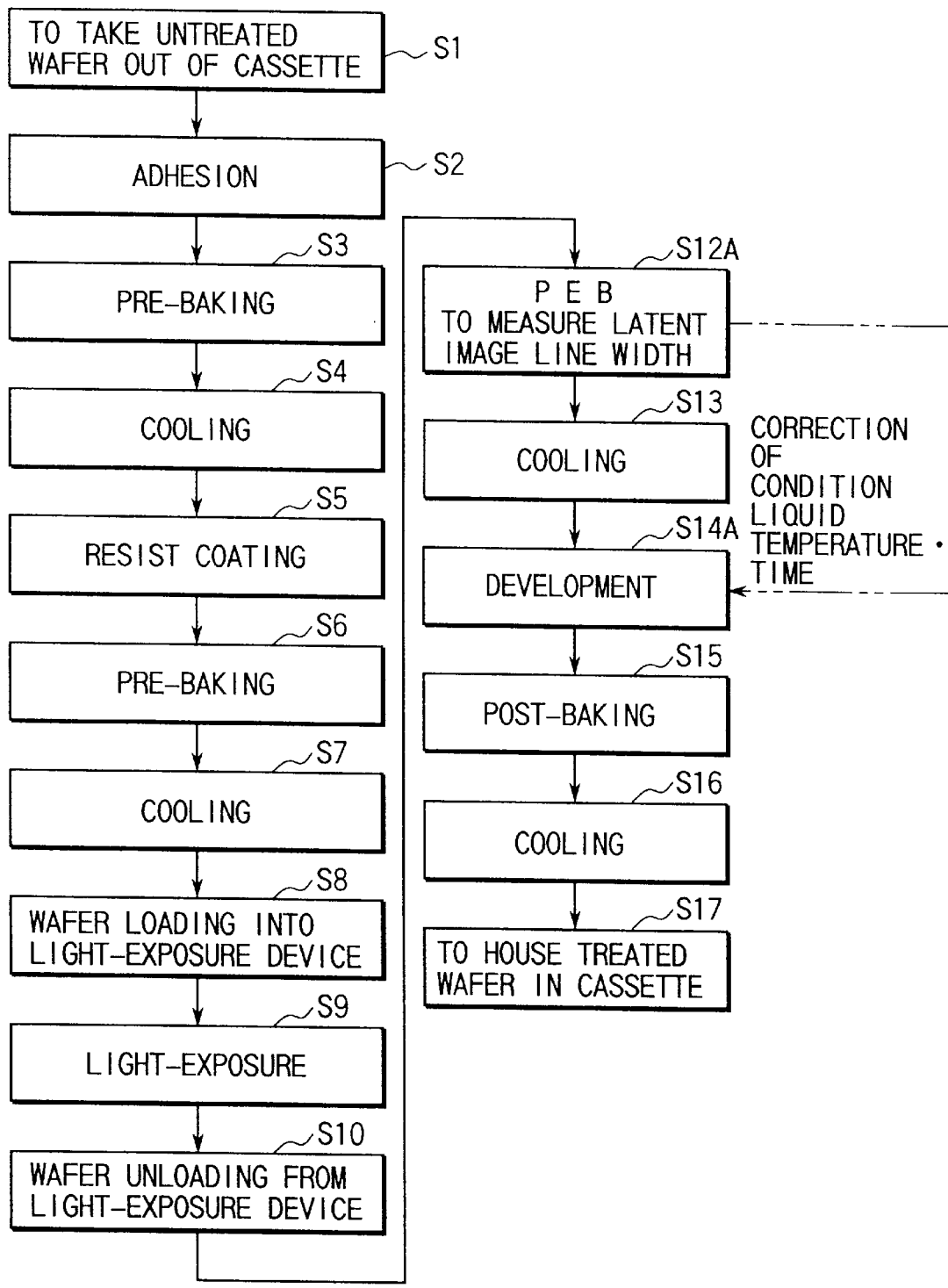
FIG. 12 is a flow chart showing a coating-developing method according to another embodiment of the present invention.

It is also possible to mount the latent image line width measuring device 25 within the post-baking unit (POBAKE). As shown in FIG. 12, the PEB treatment can be applied to the resist and, at the same time, the line width of the pattern latent image can be measured simultaneously within the post-baking unit (POBAKE) equipped with the latent image line width measuring device 25, so as to improve the through-put (step S12A).

Figure 13:
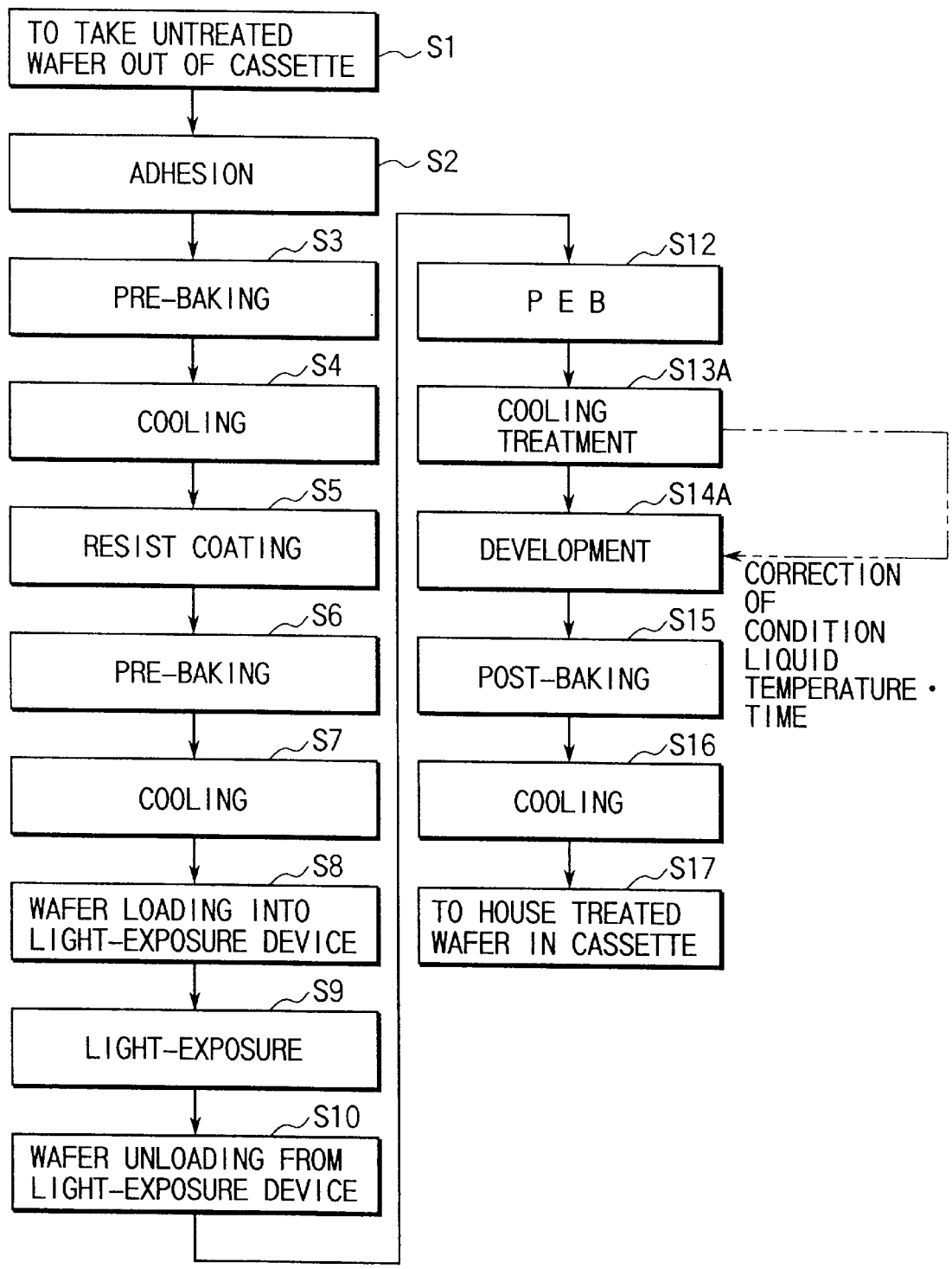
FIG. 13 is a flow chart showing a coating-developing method according to another embodiment of the present invention.

It is also possible to allow the latent image line width measuring device 25 to be arranged within the cooling unit (COL) for cooling the wafer W after the PEB treatment. In this case, the wafer W after the PEB treatment is cooled in the cooling unit (COL) and, at the same time, the line width of the pattern latent image can be measured, as shown in FIG. 13, leading to an improved through-put (step S13A).

It is desirable to correct the values of the parameters such as the developing solution temperature, developing time and concentration of the developing solution on the basis of the result of measurement of the line width of the latent image pattern in step S13A. Where the development step 14A alone is subjected to the feed forward control in this fashion, the occurrence of defective wafers can be markedly suppressed so as to improve the yield.

Figure 14:
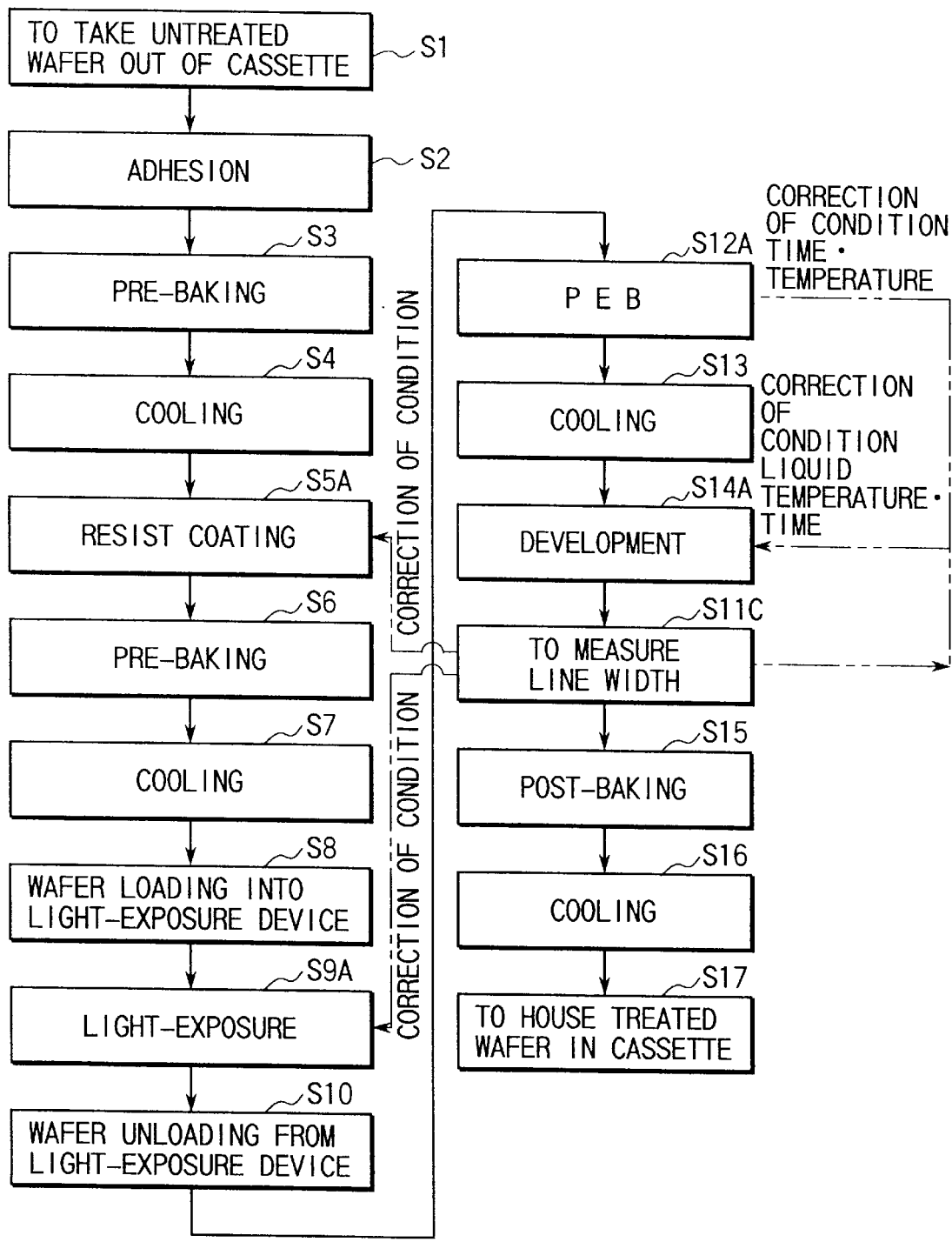
FIG. 14 is a flow chart showing a coating-developing method according to another embodiment of the present invention.

Further, FIG. 14 shows that the line width of the actual resist pattern is measured immediately after the development by a line width measuring unit (LWM) 25b shown in FIG. 11 (step S11C). In this case, the information on the measurement of the line width is fed back so as to control at least one of the resist coating conditions such as the rotating speed of the spin chuck, temperature of the resist solution and the supply rate of the resist solution, the light exposure conditions such as the light exposure time and the focal length, the baking temperature, the baking time, developing temperature and the baking time. The particular feed back control makes it possible to control the line width of the resist pattern with a high accuracy within the system 1, leading to an improved yield without fail.

Figure 15:
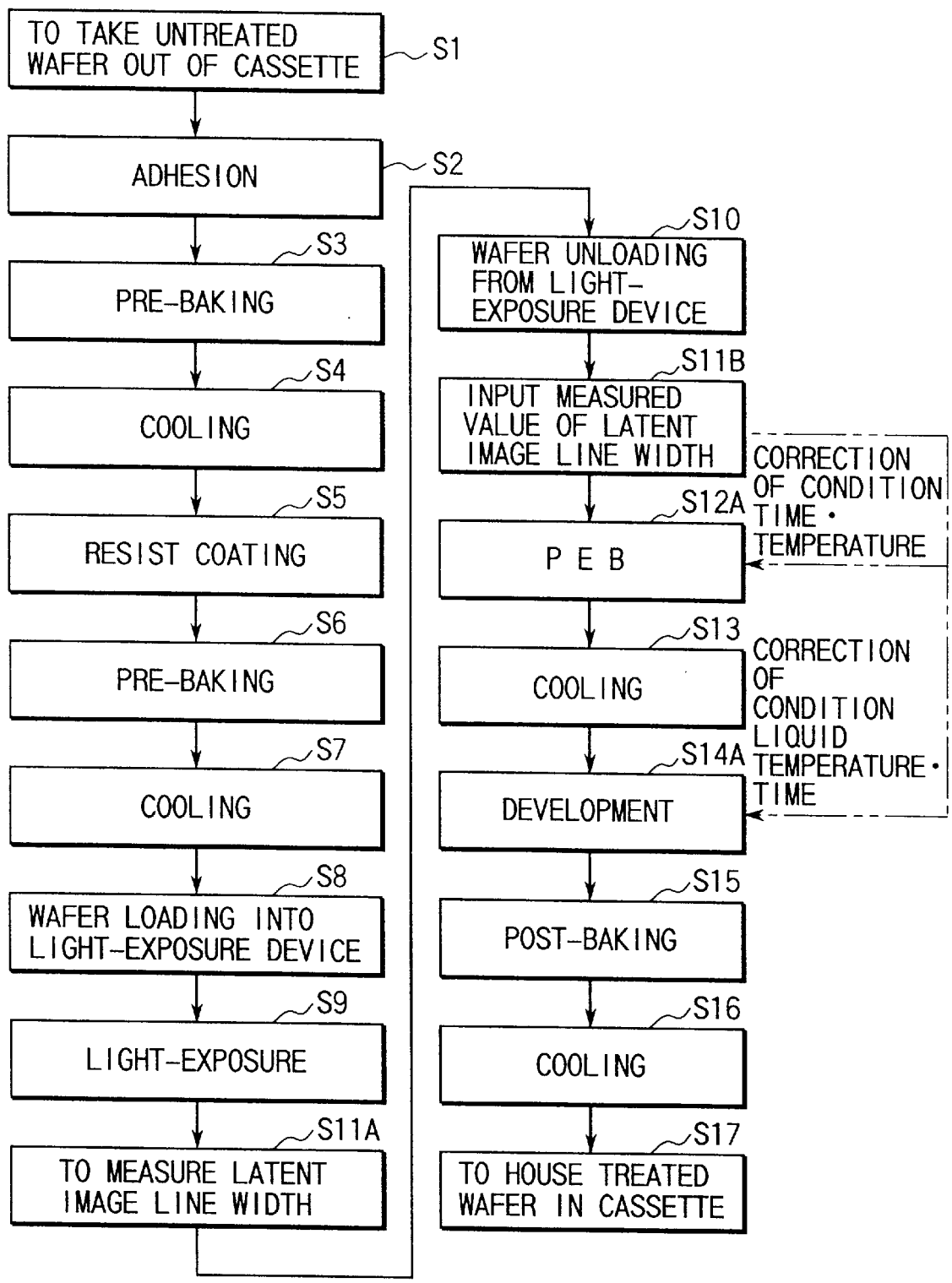
FIG. 15 is a flow chart showing a coating-developing method according to another embodiment of the present invention.

It is also possible to arrange the latent image line width measuring device 25 within a light exposure device (not shown) so as to measure the line width of the latent image pattern immediately after the light exposure step. In an apparatus of this type, it is possible to carry out the resist coating/developing operation as shown in FIG. 15. To be more specific, the line width of the latent image pattern is measured within the light exposure device (step S11A), and the data on the measured value is supplied to the CPU 45 (step S11B) so as to allow the CPU 45 to control at least one of the parameters in the PEB step S12A and the development step S14A such as the baking temperature, the baking time, the developing temperature and the developing time.

Figure 16:
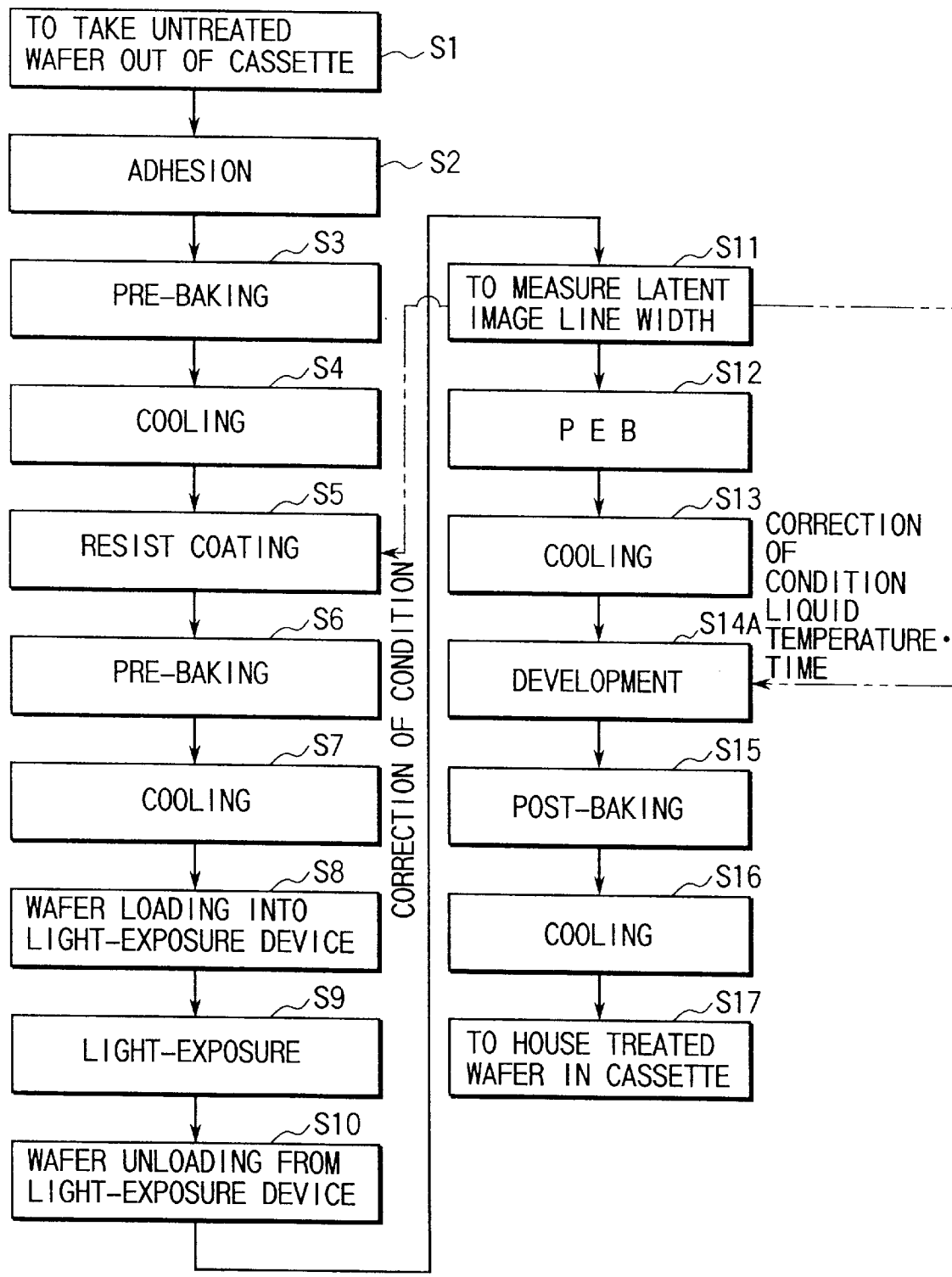
FIG. 16 is a flow chart showing a coating-developing method according to another embodiment of the present invention.

Among the process steps carried out after the light exposure step, the development step most seriously affects the line width of the actual resist pattern. It should be noted that not only the line width of the resist pattern but also the thickness of the resist film are seriously affected by the correction of the developing conditions such as the developing time, the temperature of the developing solution and the concentration of the developing solution. Therefore, where at least one of the developing parameters is corrected (step S14A), it is also desirable to correct the resist coating conditions such as the rotation speed of the spin chuck, the supply rate of the resist solution, the resist solution temperature, and the concentration of the resist solution (step S5A), as shown in FIG. 16.

Figure 17:
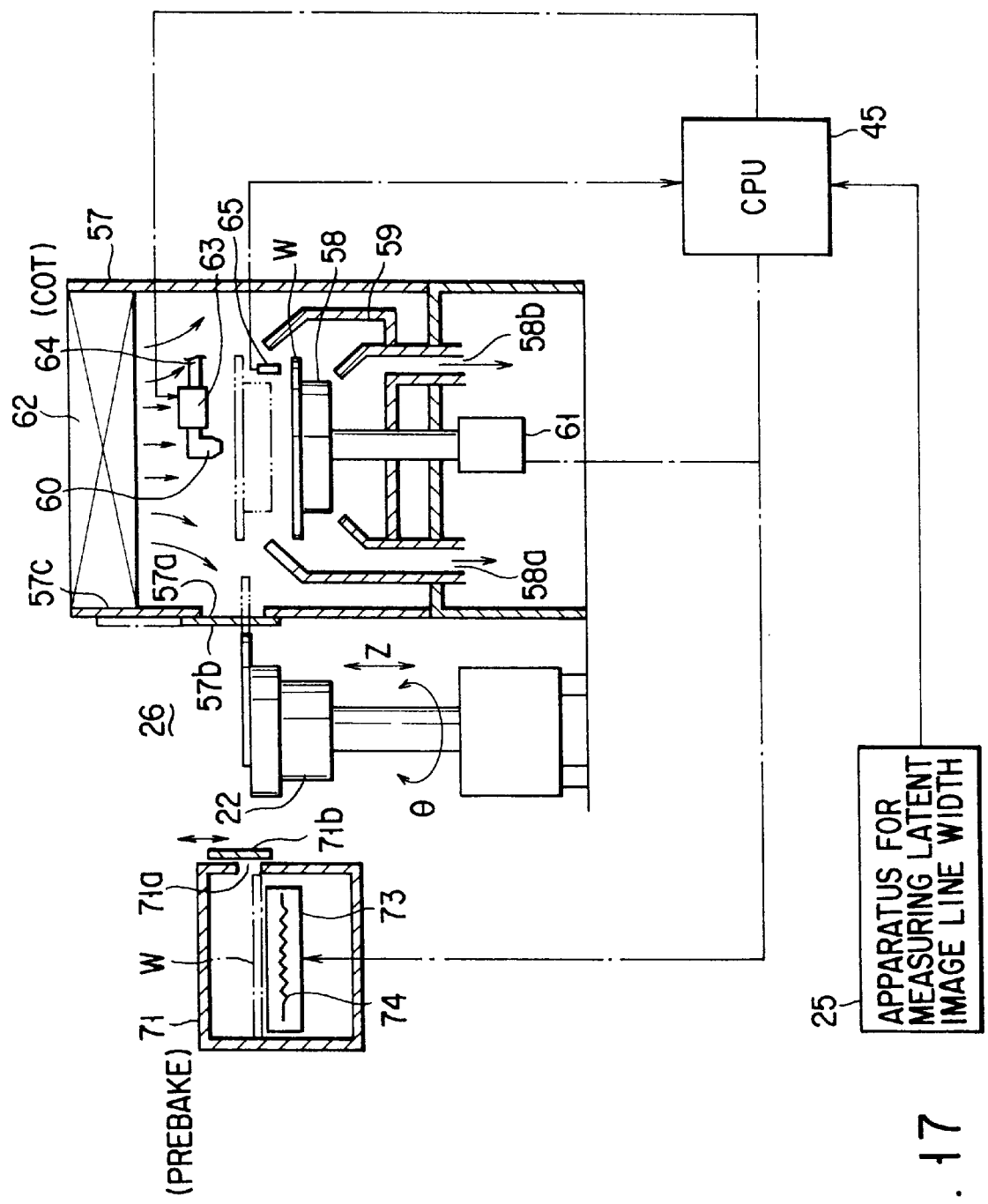
FIG. 17 is a cross sectional view schematically showing the construction of a resist coating-developing apparatus (resist coating unit and pre-baking unit) according to another embodiment of the present invention.

Let us describe how to correct the parameter in the resist coating step S5A in accordance with a difference between the measured value of the line width of the latent image pattern and the target value with reference to FIG. 17.

It should be noted that the resist coating unit (COT) is substantially equal in construction to the developing unit (DEV) in many portions. Specifically, the resist coating unit (COT) comprises a process vessel 57, a spin chuck 58, a cup 59 and a filter 62. Likewise, the pre-baking unit (PREBAKE) is substantially equal in construction to the post-baking unit (POBAKE).

The resist coating unit (COT) is provided with a nozzle 60 communicating with a resist solution supply source (not shown) via a supply pipe 64. The nozzle 60 is movably supported by an arm of a moving device (not shown) such that the nozzle 60 is movable between the home position apart from the spin chuck 58 and an operating position right above the center of rotation of the spin chuck 58.

A resist solution temperature controller 63 is mounted to the supply pipe 64 in the vicinity of the nozzle 60 so as to control the temperature of the resist solution supplied to the nozzle 60. The resist solution temperature controller 63 consists of a temperature control mechanism which permits circulating a liquid material controlled at a desired temperature through a jacket surrounding the supply pipe 64.

The pre-baking unit (PREBAKE) comprises a vessel 71, a wafer transfer port 71a, a movable shutter 71b and a hot plate 73. A resistance heat generator 74 is buried in the hot plate 73. Further, the power source of the resistance heat generator 74 is controlled by the CPU 45.

Further, a film thickness sensor 65 is arranged to face the wafer W within the resist coating unit (COT). The thickness of the resist film is detected on the spin chuck 58 by the film thickness sensor 65. As shown in the drawing, the film thickness sensor 65 is connected to the input terminal of the CPU 45. When a film thickness detection signal is supplied from the sensor 65 into the CPU 45, an arithmetic calculation is carried out within the CPU 45 on the basis of the measured value in the line width of the latent image pattern by using a predetermined formula so as to determine the control amount of each of the parameters. For example, the CPU 45 delivers a control command signal to each of the resist solution temperature controller 63, a motor 61 and a pre-baking temperature controller (not shown) so as to make optimum the parameters such as the temperature of the resist solution, the rotating speed of the wafer W in the resist coating step, and the pre-baking temperature before the resist coating step (step S3).

Figure 18:
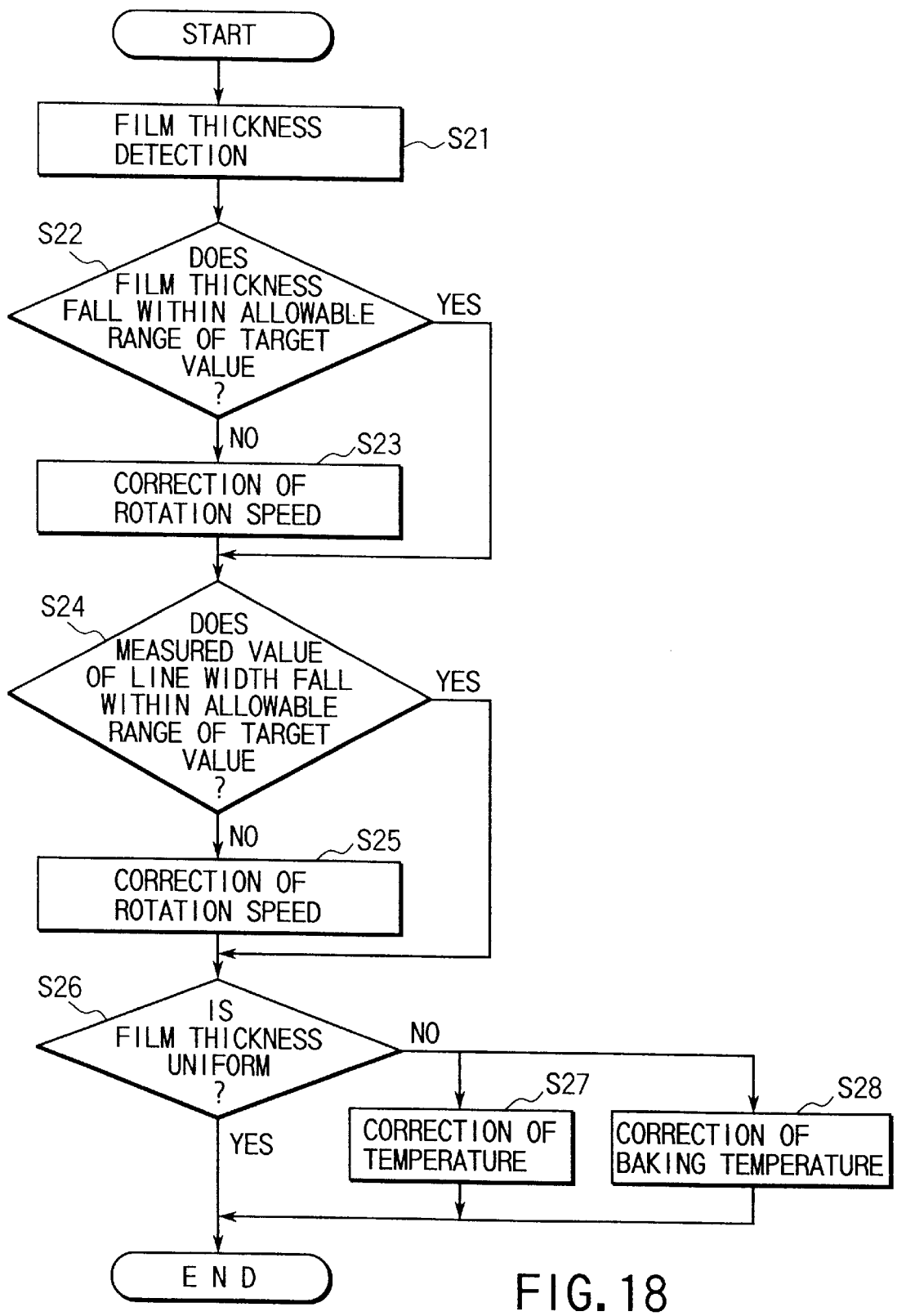
FIG. 18 is a flow chart showing the procedures for controlling the thickness and line width of a resist film.
Figure 19A:
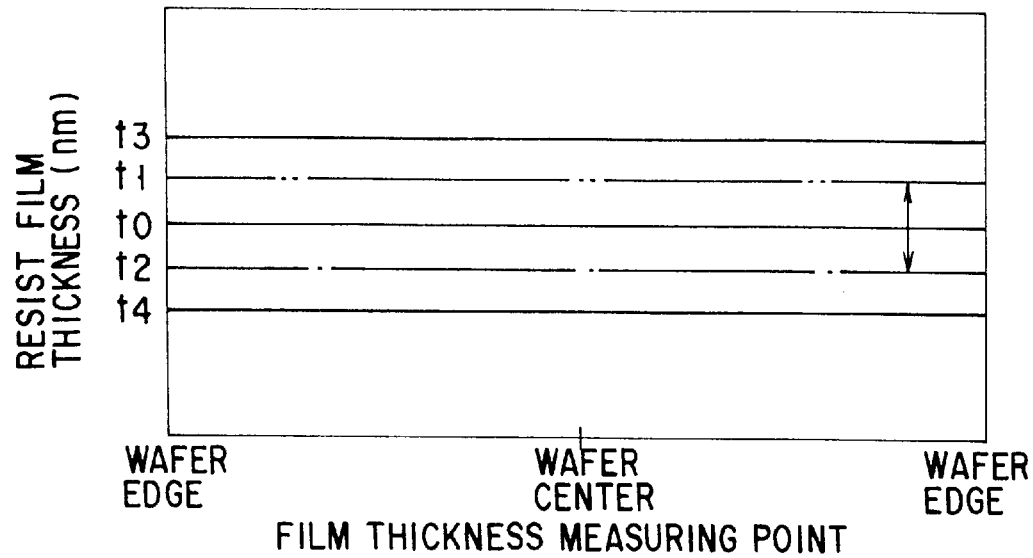
FIGS. 19A and 19B are graphs collectively showing how to control the thickness of the resist film.
Figure 19B:
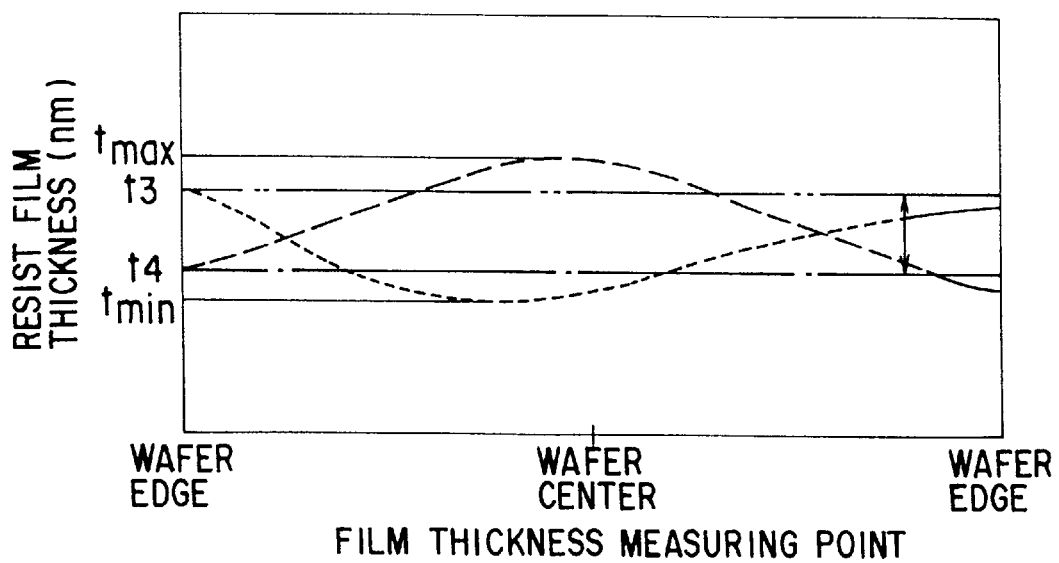

To be more specific, as shown in FIG. 18, the motor 61 is stopped after formation of a resist coating film on the surface of the wafer W, and the spin chuck 58 is moved relative to the sensor 65 so as to allow the sensor 65 to detect the thickness of the resist film at optionally selected 40 measuring points on the wafer W (step S21). If an electric signal denoting the detected resist film thickness is supplied to the CPU 45, the CPU 45 judges whether or not the detected resist film thickness falls within the allowable range of the target value in respect of each of the measuring points. In other words, the CPU 45 judges whether or not the detected resist film thickness falls within the range between the allowable upper limit $t_1$ and the allowable lower limit $t_2$ of the target value $t_0$ shown in FIG. 19A (step S22).

When the result of judgment in step S22 is "NO", the CPU 45 delivers a command signal to the power source circuit of the motor 61 so as to correct the rotation speed of the spin chuck 58 (step S23). For example, where the detected film thickness $t_3$ exceeds the upper allowable limit $t_1$, the rotation speed of the spin chuck 58 is increased so as to decrease the thickness of the resist film. By contraries, where the detected film thickness $t_4$ is smaller than the lower allowable limit $t_2$, the rotation speed of the spin chuck 58 is decreased so as to increase the thickness of the resist film. When the result of judgment in step S22 is "YES", the process proceeds to the succeeding step S24.

When an electric signal denoting the detected line width of the latent image pattern is supplied from the latent image line width measuring device 25 to the CPU 45, a comparative arithmetic operation is performed within the CPU 45 between the received electric signal and the target value so as to judge whether or not the detected line width falls within the allowable range of the target value (step S24).

When the result of judgment in step S24 is "NO", the CPU 45 delivers a command signal to the power source circuit of the motor 61 so as to correct the rotation speed of the spin chuck 58 (step S25). For example, when the detected resist film thickness $t_3$ exceeds the allowable upper limit $t_1$, the rotation speed of the spin chuck 58 is increased so as to decrease the thickness of the resist film. By contrast, when the detected resist film thickness $t_4$ is lower than the allowable upper limit $t_2$, the rotation speed of the spin chuck 58 is decreased so as to increase the thickness of the resist film. When the result of judgment in step S24 is "YES", the process proceeds to the succeeding step S26.

Finally, the CPU 45 judges whether or not the resist film exhibits a uniform profile. In other words, the CPU 45 judges whether or not the maximum thickness $t_{max}$ and the minimum thickness $t_{min}$ in the detected value of the resist film thickness falls within the allowable range between $t_3$ and $t_4$ (step S26).

When the result of judgment in step S26 is "NO", the CPU 45 delivers a command signal to each of the temperature control device 63 and the power source circuit of the heater 73 so as to correct the temperature of the resist solution and the pre-baking temperature (steps S27 and S28).

In this embodiment, the film thickness sensor 65 is arranged within the resist coating unit (COT). However, it is also possible to arrange the film thickness sensor 65 outside the resist coating unit (COT).

The thickness of the resist film can be measured by the film thickness sensor 65 at various timings, as summarized in items (1) to (3) below:

(1) A dummy wafer DW is disposed on the spin chuck 58 before start-up of the treatment of the product wafer W, and a resist solution is applied to the dummy wafer W while rotating the spin chuck 58 so as to measure the thickness of the resist film formed on the dummy wafer DW.

(2) The thickness of the resist film is measured upon completion of the resist coating treatment applied to 25 product wafers constituting a single lot.

(3) The thickness of the resist film is measured upon completion of the resist coating treatment of each of the product wafers W.

In the embodiment described above, it is possible to control the thickness of the resist film and the pattern line width during the actual semiconductor manufacturing process on the real time basis, leading to an improved through-put. It is also possible to achieve the film thickness control with a high accuracy by applying a feed forward control to the developing treatment.

Figure 20:
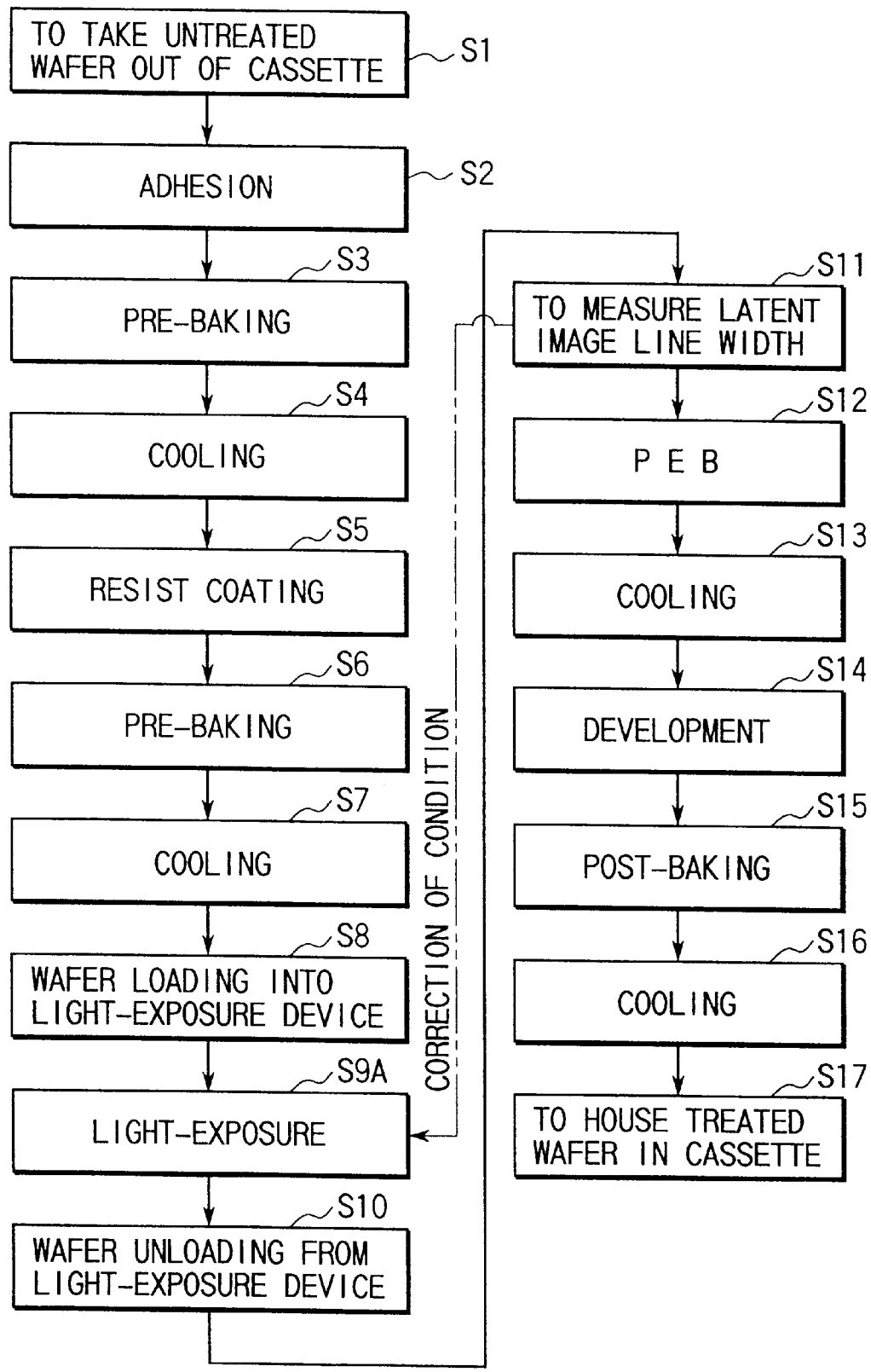
FIG. 20 is a flow chart showing a coating-developing method according to still another embodiment of the present invention.

FIG. 20 shows another embodiment of the present invention. In this embodiment, the light exposure step S9A is controlled by feeding back the result of the line width measurement of the latent image pattern. To be more specific, the line width of the latent image pattern is measured before the PEB step S12 (step S11), and the CPU 45 delivers a command signal to the light exposure device based on the result of the line width measurement noted above so as to correct each of the conditions in the light exposure step S9A such as the light exposure time, the light exposure focus point, and the intensity of the ultraviolet light emitted from the light source for the light exposure. It is also possible to measure the line width of the actually formed resist pattern (resist pattern after the development) so as to correct each of the conditions in the light exposure step S9A based on the result of the actual line width measurement. Further, it is possible to transmit the result of the line width measurement of the latent image pattern or the result of the line width measurement of the actual resist pattern from the resist coating-developing system to the controller (not shown) of the light exposure device so as to permit the arithmetic operation to obtain the value of correction of the various parameters to be carried out on the side of the light exposure device.

In each of the embodiments described above, a resist treatment is applied to a semiconductor wafer. However, it is also possible to apply the resist treatment of the present invention to other substrates such as an LCD substrate.

In the present invention, the line width of the actually formed resist pattern is measured, and the result of the measurement is fed back for controlling the developing solution temperature, the developing time, the heating temperature of the substrate before the development, the heating time of the substrate before the development, the light exposure time in the light exposure device, and the light exposure focus. It follows that the line width of the actual resist pattern in the subsequent development cycle can be controlled with a high accuracy so as to improve both the through-put and the yield.

It should also be noted that, in the present invention, the line width of the latent image pattern of the resist film after the light exposure step is measured, and the result of the measurement is fed forward or backward for controlling the developing solution temperature, the developing time, the heating temperature of the substrate before the development, the heating time of the substrate before the development, the light exposure time in the light exposure device and the light exposure focus. It follows that the line width of the resist pattern can be controlled on the real time basis with a high accuracy, making it possible to improve both the through-put and the yield.

It should also be noted that, in the present invention, the information on the measurement of the line width of the latent image pattern of the resist film after the light exposure step is obtained from the light exposure device, and the particular information is fed forward for controlling the developing solution temperature, the developing time, the heating temperature of the substrate before the development. And the heating time of the substrate before the development. It follows that the line width of the resist pattern can be controlled on the real time basis with a high accuracy, making it possible to improve both the through-put and the yield.

What should also be noted is that, in the present invention, the line width of the latent image pattern of the resist film after the light exposure is measured, and the result of the line width measurement is fed back for controlling the developing solution temperature and the developing time and for controlling the thickness of the coated resist film, making it possible to prevent the thickness of the resist film after the development from being affected by the change in the developing conditions.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:
1. A resist coating-developing method, comprising:
  (a) a setting step for setting a target value and an allowable range thereof in respect of each of a pattern line width and a thickness of a resist film which is to be formed on a substrate;
  (b) a resist-coating step for coating a surface of said substrate with a photoresist solution;
  (c) a pre-baking step for baking a photoresist film formed on said surface of the substrate;
  (d) a first cooling step for cooling the baked substrate;
  (e) a light-exposure step for selectively exposing said photoresist coating film to light in a predetermined pattern;
  (f) a line width measuring step for measuring a line width of a latent image formed on the resist coating film selectively exposed in advance to light;
  (g) a post-baking step for baking the resist coating film selectively exposed in advance to light to form a pattern;
  (h) a second cooling step for cooling said baked substrate;
  (i) a developing step for developing the resist coating film selectively exposed to light in advance to form a pattern by applying a developing solution to the substrate;
  (j) a judging step for judging whether or not the value of the line width of the latent image measured in said step (f) of measuring the latent image line width falls within said allowable range of said target value set in said step (a);
  (k) a calculating step for calculating a difference between the measured value of the latent image line width and the target value, when the measured value of the latent image line width fails to fall within the allowable range of the target value, so as to determine a correcting amount in the process conditions in the steps falling within a range of between said resist coating step (b) and said developing step (i); and
  (l) a correcting step for correcting the process condition in at least one step selected from the group consisting of the post-baking step (g) and the developing step (i), said correcting step being carried out in accordance with the correcting amount obtained in said step (k).

2. The method according to claim 1, wherein said latent image line width measuring step (f) is carried out before said post-baking step (g).

3. The method according to claim 1, wherein said latent image line width measuring step (f) is carried out simultaneously with said post-baking step (g).

4. The method according to claim 1, wherein said latent image line width measuring step (f) is carried out after said post-baking step (g).

5. The method according to claim 1, wherein at least one of the heating temperature and heating time of the substrate in said step (g) is corrected in said step (l).

6. The method according to claim 1, wherein at least one of the developing solution temperature and developing time in said developing step (i) is corrected in said step (l).

7. The method according to claim 1, comprising:

performing said line width measuring step (f) simultaneously with said second cooling step (h).

8. A resist coating-developing method, comprising:

(A) a setting step for setting a target value and an allowable range thereof in respect of each of a pattern line width and a thickness of a resist film which is to be formed on a substrate;

(B) a resist-coating step for coating a surface of said substrate with a photoresist solution;

(C) a pre-baking step for baking a photoresist film formed on said surface of the substrate;

(D) a first cooling step for cooling the baked substrate;

(E) a light-exposure step for selectively exposing said photoresist coating film to light in a predetermined pattern;

(F) a post-baking step for baking the resist coating film selectively exposed in advance to light to form a pattern;

(G) a second cooling step for cooling said baked substrate;

(H) a developing step for developing the resist coating film selectively exposed to light in advance to form a pattern by applying a developing solution to the substrate;

(I) a line width measuring step for measuring a line width of the developed resist pattern;

(J) a judging step for judging whether or not the value of the line width measured in said step (I) of measuring the line width of the developed resist pattern falls within said allowable range of said target value set in said step (a);

(K) a calculating step for calculating a difference between the measured value of the line width and the target value, when the measured value of the line width fails to fall within the allowable range of the target value, so as to determine a correcting amount in the process conditions in the steps falling within a range of between said resist coating step (B) and said developing step (I); and (L) a correcting step for correcting the process condition in at least one step selected from the group consisting of the post-baking step (G) and the developing step (I), said correcting step being carried out in accordance with the correcting amount obtained in said step (K).

9. The method according to claim 8, wherein at least one of the heating temperature and heating time of the substrate in said post-baking step (F) is corrected in said step (L).

10. The method according to claim 8, wherein at least one of the developing solution temperature and developing time in said developing step (H) is corrected in said step (L).

11. The method according to claim 8, wherein said line width measuring step (I) is carried out after said developing step (H) and before a second post-baking treatment for baking the resist film developed.

\* \* \* \* \*